United States Patent
Ueda

(10) Patent No.: US 9,000,559 B2
(45) Date of Patent: Apr. 7, 2015

(54) SEMICONDUCTOR DEVICE, METHOD OF CUTTING ELECTRICAL FUSE, AND METHOD OF DETERMINING ELECTRICAL FUSE STATE

(75) Inventor: Takehiro Ueda, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 893 days.

(21) Appl. No.: 11/802,469

(22) Filed: May 23, 2007

(65) Prior Publication Data

US 2007/0278616 A1     Dec. 6, 2007

(30) Foreign Application Priority Data

Jun. 6, 2006 (JP) ................................. 2006-157592

(51) Int. Cl.
*H01L 29/00* (2006.01)
*H01L 23/525* (2006.01)

(52) U.S. Cl.
CPC ..... *H01L 23/5256* (2013.01); *H01L 2924/0002* (2013.01)

(58) Field of Classification Search
USPC .......................... 257/529–530, 534, 536–537
See application file for complete search history.

(56) References Cited

U.S. PATENT DOCUMENTS

| | | | | | |
|---|---|---|---|---|---|
| 5,412,593 | A | * | 5/1995 | Magel et al. | 365/96 |
| 5,608,257 | A | * | 3/1997 | Lee et al. | 257/529 |
| 6,872,648 | B2 | * | 3/2005 | Friese et al. | 438/601 |
| 2002/0185706 | A1 | * | 12/2002 | Ikegami | 257/529 |
| 2002/0185760 | A1 | * | 12/2002 | Suga | 264/1.33 |
| 2004/0262710 | A1 | * | 12/2004 | Ueda | 257/529 |
| 2005/0029620 | A1 | * | 2/2005 | Ueda | 257/529 |

FOREIGN PATENT DOCUMENTS

| | | |
|---|---|---|
| JP | 7312390 | 11/1995 |
| JP | 2004-103610 | 4/2004 |
| JP | 2005-057186 | 3/2005 |

OTHER PUBLICATIONS

JP Office Action dated Nov. 1, 2011, with English Translation.

* cited by examiner

*Primary Examiner* — Matthew W Such
*Assistant Examiner* — Ali Naraghi
(74) *Attorney, Agent, or Firm* — Young & Thompson

(57) ABSTRACT

A semiconductor device includes a semiconductor substrate and an electrical fuse formed on the semiconductor substrate, and including a first conductor and a second conductor electrically separated from the first conductor. In a state of the electrical fuse after a cutting processing, the first conductor is cut and separated into a first part electrically separated from the second conductor and a second part including a flowing region from which a material constituting the first conductor flows outward and which is electrically connected to the second conductor.

26 Claims, 13 Drawing Sheets

FIG. 13A Prior Art
FIG. 13B Prior Art
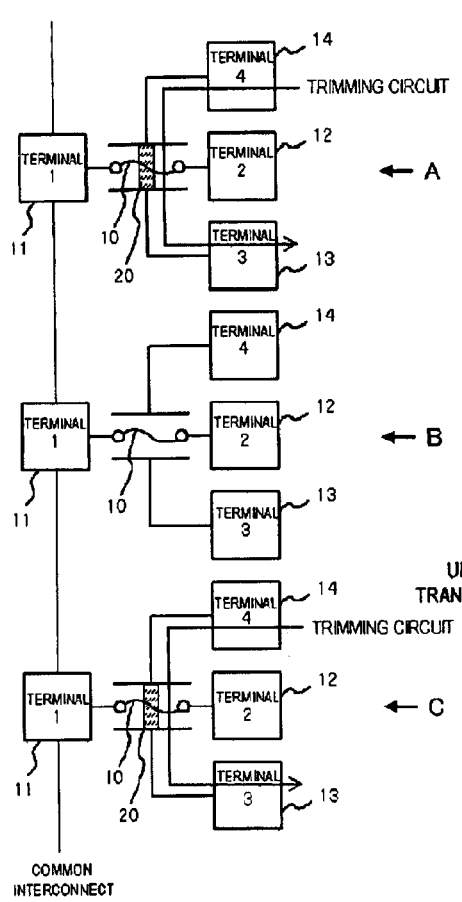
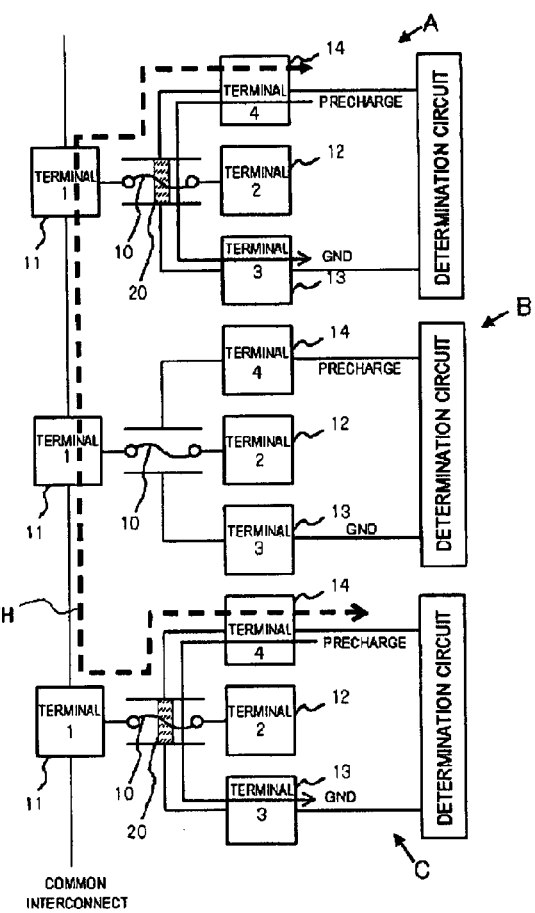

SEMICONDUCTOR DEVICE, METHOD OF CUTTING ELECTRICAL FUSE, AND METHOD OF DETERMINING ELECTRICAL FUSE STATE

This application is based on Japanese Patent application NO. 2006-157592, the content of which is incorporated hereinto by reference.

BACKGROUND

1. Technical Field

The present invention relates to a semiconductor device, a method of cutting an electrical fuse, and a method of determining an electrical fuse state. More specifically, the present invention relates to a semiconductor device including an electrical fuse, a method of cutting an electrical fuse, and a method of determining an electrical fuse state.

2. Related Art

A technology is conventionally known, in which a fuse is mounted in a semiconductor device, and the fuse is broken, so that a value of a resistance employed in the semiconductor device is suitably adjusted, or a failure element is separated and replaced into a normal element.

Typical manner for cutting a fuse includes cutting a fuse by irradiating a laser beam in a portion of the fuse and cutting a fuse by applying an electric current.

Japanese Laid-Open Patent Publication No. 2005-57186 discloses an electrical fuse that is cut by utilizing the phenomenon that constituent materials of an electrical fuse move by electromigration. Furthermore, the Japanese Laid-Open Patent Publication No. 2005-57186 discloses a configuration of the electrical fuse in which a cutting target region is surrounded by a plate, thereby confining or accumulating heat generated in the cutting target region when current is applied to the electrical fuse and accelerating cutting the electrical fuse.

Japanese Laid-Open Patent Publication No. 2004-103610 discloses a trimming pattern (an electrical fuse) for making an adjustment while selecting on or off for the connection of an adjustment circuit prepared in a semiconductor integrated circuit in advance. FIG. 10 is a schematic plan view of the trimming pattern disclosed in the Japanese Laid-Open Patent Publication No. 2004-103610. The trimming pattern includes two pads 11 and 12 to which a voltage is applied, a fine interconnect 10 connecting the two pads 11 and 12, and two connecting portions 13 and 14 which are located on each of both sides of the fine interconnect 10 without making contact with the fine interconnect 10 and connected to the circuit for adjustment and the semiconductor integrated circuit. Trimming is carried out using this trimming pattern not by applying a voltage between the pads 11 and 12 to flow a current so that the fine interconnect 10 is melted and cut and thereby turning off the circuit for adjustment, which is connected to the pads but in accordance with a method for connecting the melted metal of the fine interconnect 10 to the connecting portions 13 and 14, and thus, turning on the circuit for adjustment, which is connected to the connecting portions 13 and 14. It is easier to make the melted metal contact with the connecting portions 13 and 14, which are close by, than to melt and cut the fine interconnect 10, and thus, it can be said that trimming can be carried out easier and in a short period of time.

The present inventor has recognized that the conventional techniques stated above have the following problems.

If the electrical fuse configured as disclosed in the Japanese Laid-Open Patent Publication No. 2005-57186 is cut, then a resistance of a cutting region is increased, and a current value of the current flowing through the electric fuse is reduced. With the conventional techniques, it is determined whether the electrical fuse has been cut by determining whether a potential of one terminal of the electrical fuse is kept after a predetermined potential is applied to the terminal. FIG. 11 shows configurations of a conventional electrical fuse and a conventional determination circuit.

An electrical fuse 1001a includes a conductor 1002a and terminals 1004a and 1006a arranged on both ends of the conductor 1002a. The terminal 1006a of the electrical fuse 1001a is connected to a determination circuit 1010a. Further, the terminal 1004a of the electrical fuse 1001a is connected to a common interconnect 1020 common to and a terminal 1004b of another electrical fuse 1001b. The electrical fuse 1001b is similar in configuration to the electrical fuse 1001a.

Next, a method of determining whether an electrical fuse has been cut will be described. It is assumed that the electrical fuse 1001a is in a sufficiently cutting state and that the electrical fuse 1001b is in an insufficiently cutting state. If it is to be determined whether the electrical fuse 1001a has been cut, then the common interconnect 1020 is grounded, and a predetermined potential is applied from the determination circuit 1010a to the terminal 1006a, thereby detecting a potential of the terminal 1006a of the electrical fuse 1001a. If the electrical fuse 1001a is not cut, then a current is flown between the terminals 1006a and 1004a and the potential of the terminal 1006a is not kept because the common interconnect 1020 is grounded. On the other hand, if the electrical fuse 1001a is cut, no current is flown between the terminals 1006a and 1004a. Therefore, the potential of the terminal 1006a is kept and the determination circuit 1010a detects charge. As a result, it is correctly determined that the electrical fuse 1001a has been cut.

However, if for example, the electrical fuse 1001b is incompletely cut although a cutting processing has been performed on the electrical fuse 1001b, the following problems occur. A current is flown between the terminals 1006b and 1004b, the potential of the terminal 1006b is not kept, and it is erroneously determined that the electrical fuse 1004b is not cut.

To avoid such an erroneous determination, a higher potential may be applied from the determination circuit to the terminal. If the higher potential is applied, the following new problems occur. Generally, a plurality of electrical fuses included in a semiconductor device is connected to one another by a common interconnect for area saving. FIG. 12 shows a configuration in which three electrical fuses (electrical fuses 1001a, 1001b, and 1001c) are connected to one another by a common interconnect 1020. If one of the electrical fuses 1001a, 1001b, and 1001c is to be cut, then a power supply voltage is applied to the common interconnect 1020, the electrical fuse to be cut is selected, an end of the common interconnect 1020 opposite to an end to which the power supply voltage is applied is grounded, and current is flown through the electrical fuse. If it is to be determined whether the electrical fuse has been cut, then the common interconnect 1020 is grounded, and a predetermined potential is applied to terminals from determination circuits. Furthermore, current flowing through each of the electrical fuses is detected to thereby determine whether one of the electrical fuses has been cut. At this time, the current flows into the common interconnect 1020 from the uncut electrical fuses. If the potentials applied to the terminals from the corresponding determination circuits are higher, an amount of the current flowing from many electrical fuses increases. As a result, the potential of the common interconnect 1020 floats. As a result, it is erroneously determined that the electrical fuses have been cut although they are not actually cut.

According to the technique disclosed in the Japanese Laid-Open Patent Publication No. 2004-103610, it is determined whether the electrical fuse has been cut by contacting the molten metal with the connecting portions 13 and 14 near the fine interconnect 10 instead of melting and cutting off the fine interconnect 10 of the trimming pattern. However, if the fine interconnect 10 is not cut when current is flown through the trimming pattern, the following problems occur.

FIGS. 13A and 13B show a configuration in which a plurality of electrical fuses (A, B, and C) similar to the electrical fuse (trimming pattern) disclosed in the Japanese Laid-Open Patent Publication No. 2004-103610 is arranged. Generally, a plurality of electrical fuses is arranged in parallel on a semiconductor substrate. Further, the electrical fuses are connected to a common interconnect for suppressing an increase in area to which the electrical fuses are arranged. Here, an instance in which pads 11 are connected to one another by the common interconnect is shown. If a voltage is applied to melt a fine interconnect 10 of an electrical fuse, then a voltage is applied to the common interconnect, the pad 12 of the electrical fuse is selectively grounded, for example, and current is flown through the fine interconnect 10. The fine interconnect 10 is thereby molten.

For example, in each of the electrical fuses A and C, a molten metal 20 of the fine interconnect 10 is in contact with connecting portions 13 and 14 (see FIG. 13A). With such a configuration, to determine whether the electrical fuse A has been cut, the connecting portion 13 is grounded and a potential is applied to the connecting portion 14. If the fine interconnect 10 is not cut from the pad 11 in the electrical fuse A, then a current is flown from the pad 11 of the electrical fuse A via the common interconnect, and the voltage is transmitted to the connecting portion 14 of the electrical fuse C via the pad 11 of the electrical fuse C (see FIG. 13B). If such an unintended transmission path is occurred, the potential applied to the electrical fuses from corresponding determination circuits causes a potential of the common interconnect to float. As a result, it cannot be correctly determined whether the electrical fuse A has been cut.

Moreover, with the configuration disclosed in the Japanese Laid-Open Patent Publication No. 2004-103610, it is necessary to provide the two connecting portions 13 and 14. As a result, an area necessary for formation of the trimming pattern disadvantageously increases.

SUMMARY

According to the present invention, there is provided a semiconductor device including:

a semiconductor substrate; and an electrical fuse formed on the semiconductor substrate, and including a first conductor and a second conductor electrically separated from the first conductor;

wherein in a state of the electrical fuse after a cutting processing, the first conductor is cut and separated into a first part electrically separated from the second conductor and a second part including a flowing portion from which a material constituting the first conductor flows outward and which is electrically connected to the second conductor. In this case, by flowing a predetermined current through the first conductor, the cutting processing can be performed on the electrical fuse.

According to the present invention, there is provided a method of cutting an electrical fuse, the electrical fuse being formed on a semiconductor substrate, and including a first conductor and a second conductor electrically separated from the first conductor, including:

flowing a predetermined current through the first conductor, forming a flowing portion electrically connected to the second conductor by causing a material constituting the first conductor to flow outward, and cutting off and separating the first conductor into a first part electrically separated from the second conductor and a second part including the flowing region.

With such a configuration, the electrical fuse may function as a switch element in which the second part of the first conductor is electrically connected to one of the first part of the first conductor and the second conductor and electrically disconnected from the other. It is thereby possible to determine whether the electrical fuse has been cut in various manners. For example, it is possible to detect whether the cutting processing has been performed on the electrical fuse by detecting a state of an electrical connection between the first part and the second part of the first conductor. Moreover, it is possible to detect whether the cutting processing has been performed on the electrical fuse by detecting a state of an electrical connection between the second part of the first conductor and the second conductor.

If the cutting processing is performed on the electrical fuse according to the present invention, a "flowing region" is formed. In this case, the term "outward" may be outside of a region in which the first conductor is formed in the state before the cutting processing. For example, the first conductor may be an interconnect buried in an interconnect groove formed in an insulating film. In this case, "outward" may be outside of the interconnect groove in which the interconnect is formed. By allowing such a flowing region to be formed in the first conductor, it is possible to ensure a cutting of the first conductor into the first part and the second part, and a forming of a large cutting portion. Further, because the cutting portion is provided in a different area from the flowing region, the probability of reconnecting of the cut electrical fuse can be greatly reduced.

The semiconductor device according to the present invention may further include:

a determination unit applying a predetermined first potential to the second part and detecting a potential of the second part in a state in which the first part of the first conductor is grounded, determining that the cutting processing has been performed on the electrical fuse if the potential of the second part is higher than a reference potential, and determining that the cutting processing has not been performed on the electrical fuse if the potential of the second part is lower than the reference potential; and a potential application unit applying a predetermined second potential to the second conductor.

According to the present invention, there is provided a method of determining an electrical fuse state, the electrical fuse being formed on a semiconductor substrate, and including a first conductor and a second conductor electrically separated from the first conductor, the first conductor being cut and separated into a first part electrically separated from the second conductor and a second part including a flowing region from which a material constituting the first conductor flows outward and which is electrically connected to the second conductor in a state of the electrical fuse after a cutting processing, including:

grounding the first part of the first conductor, applying a predetermined potential to the second part and detecting a potential of the second part, determining that the cutting processing has been performed on the electrical fuse if the potential of the second part is higher than a reference potential, and determining that the cutting processing has not been performed on the electrical fuse if the potential of the second part is lower than the reference potential, in a state in which a predetermined potential is applied to the second conductor.

In case that the determination unit or the determining method configured as described above is used, when cutting processing has not been performed on the electrical fuse, the second part is electrically connected to the first part. Therefore when a predetermined potential is applied to the second part in a state in which the first part is grounded, current is flown from the second part to the first part and the potential of the second part is grounded. On the other hand, the second part is not electrically connected to the first part if the cutting processing has been performed on the electrical fuse. Due to this, when a predetermined potential is applied to the second part, the potential is held by the second part. Therefore, by detecting the potential of the second part, it is possible to determine whether the electrical fuse has been cut.

However, as described above, when the cutting between the first part and the second part is insufficient, then current is flown from the second part to the first part, and the potential of the second part is lowered even if the cutting processing has been performed on the electrical fuse. As a result, it is possibly erroneously determined that the cutting processing has not been performed on the electrical fuse.

With the configuration according to the present invention, if the cutting processing has been performed on the electrical fuse, the second conductor is electrically connected to the second part of the first conductor. If a predetermined potential is also applied to the second conductor in such a state, then the predetermined potential is also held by the second part, and the potential held by the second part can be increased. It is thereby possible to reduce the number of erroneous determinations if the cutting processing has been performed on the electrical fuse.

On the other hand, if the cutting processing has not been performed on the electrical fuse, the second conductor is not electrically connected to the first conductor. Due to this, even with such a configuration, no influence is given to determination whether the cutting processing has not been performed on the electrical fuse. Thus, the configuration according to the present invention enables improving the determination accuracy for the electrical fuse.

According to the present invention, if a ground potential is detected, for example, it may be determined that the potential is low. If the potential almost equal to that applied to the second part is detected, it may be determined that the potential is high. Furthermore, a predetermined reference potential may be set. If the detected potential is lower than the predetermined reference potential, it may be determined that the potential is low. If the detected potential is higher than the predetermined reference potential, it may be determined that the potential is high. The same thing holds true for the following aspects.

The semiconductor device according to the present invention may further include:

a determination unit applying a predetermined third potential to the second conductor and detecting a potential of the second conductor in a state in which the second part is grounded, determining that the cutting processing has been performed on the electrical fuse if the potential of the second conductor is lower than a reference potential, and determining that the cutting processing has not been performed on the electrical fuse if the potential of the second conductor is higher than the reference potential.

According to the present invention, there is provided a method of determining an electrical fuse state, the electrical fuse being formed on a semiconductor substrate, and including a first conductor and a second conductor electrically separated from the first conductor, the first conductor being cut and separated into a first part electrically separated from the second conductor and a second part including a flowing region from which a material constituting the first conductor flows outward and which is electrically connected to the second conductor in a state of the electrical fuse after a cutting processing, including:

applying a predetermined potential to the second conductor and detecting a potential of the second conductor in a state in which the second part of the first conductor is grounded, determining that the cutting processing has been performed on the electrical fuse if the potential of the second conductor is lower than a reference potential, and determining that the cutting processing has not been performed on the electrical fuse if the potential of the second conductor is higher than the reference potential.

The determination unit or determination method configured as described above can operate or can be executed in a similar manner to a conventional unit or method of detecting a connection state of an antifuse. As described above, by allowing such a flowing region to be formed in the first conductor, it is possible to ensure a cutting of the first conductor into the first part and the second part, and a forming of a large cutting portion. Due to this, even if a plurality of electrical fuses is connected to one another by a common interconnect, it is possible to prevent occurrence of the unintended current path described with reference to FIG. 13B and improve determination accuracy.

The semiconductor device according to the present invention may further include:

a plurality of the electrical fuses;

a plurality of determination units provided to correspond to the plurality of electrical fuses, each of the plurality of determination units applying a predetermined first potential to the second part and detecting a potential of the second part in a state in which the first part of the first conductor is grounded, determining that the cutting processing has been performed on corresponding one of the plurality of electrical fuses if the potential of the second part is higher than a reference potential, and determining that the cutting processing has not been performed on the corresponding one of the plurality of electrical fuses if the potential of the second part is lower than the reference potential; and a second common interconnect connecting the second conductor of each of the plurality of electrical fuses in common.

According to the present invention, there is provided a method of determining an electrical fuse state, the electrical fuse being formed on a semiconductor substrate, and including a first conductor and a second conductor electrically separated from the first conductor, the first conductor being cut and separated into a first part electrically separated from the second conductor and a second part including a flowing region from which a material constituting the first conductor flows outward and which is electrically connected to the second conductor in a state of the electrical fuse after a cutting processing, including:

electrically connecting the second conductor of each of a plurality of the electrical fuses in common, applying a predetermined first potential to the second part and detecting a potential of the second part in a state in which the first part of the first conductor is grounded, determining that the cutting processing has been performed on corresponding one of the plurality of electrical fuses if the potential of the second part is higher than a reference potential, and determining that the cutting processing has not been performed on the corresponding one of the plurality of electrical fuses if the potential of the second part is lower than the reference potential.

According to the configuration of the present invention, if the cutting processing has been performed on the electrical fuse, the second conductor is electrically connected to the second part of the first conductor. In such a state, when second conductors of a plurality of electrical fuses are connected to one another by a common interconnect, the potential of the second part of one of the electrical fuses can be increased by the potential held by the second part of the other electrical fuse even if one of the electrical fuses is insufficiently cut and the potential of the second part of the electrical fuse is lowered. Furthermore, it is possible to stably keep potentials of second parts high in all the electrical fuses that have been subjected to the cutting processing. It is thereby possible to reduce erroneous determinations if the cutting processing has been performed on the cutting-target electrical fuse.

On the other hand, if the cutting processing has not been performed on any electrical fuses, the second conductor is not electrically connected to the first conductor. Due to this, even with such a configuration, no influence is given to determination whether the cutting processing has not been performed on the electrical fuse. Thus, the configuration according to the present invention enables improving the determination accuracy for the electrical fuse.

The semiconductor device according to the present invention may further include:

an electrical fuse group including a plurality of the electrical fuses;

a second common interconnect connecting the second conductor of each of the plurality of electrical fuses in common; and a determination unit provided in the plurality of electrical fuses in common, applying a predetermined fourth potential to the second conductor via the second common interconnect and detecting a potential of the second common interconnect in a state in which the second part of the first conductor of each of said plurality of electrical fuses is grounded, determining that the cutting processing has been performed on the electrical fuse group if the potential of the second common interconnect is lower than a reference potential, and determining that the cutting processing has not been performed on the electrical fuse group if the potential of the second common interconnect is higher than the reference potential.

According to the present invention, there is provided a method of determining an electrical fuse state, the electrical fuse being formed on a semiconductor substrate, and including a first conductor and a second conductor electrically separated from the first conductor, the first conductor being cut and separated into a first part electrically separated from the second conductor and a second part including a flowing region from which a material constituting the first conductor flows outward and which is electrically connected to the second conductor in a state of the electrical fuse after a cutting processing, including:

selecting a plurality of the electrical fuses as an electrical fuse group and connecting the second conductor of each of the plurality of electrical fuses in common, applying a predetermined potential to the second conductor electrically connected in common and detecting a potential of the second conductor in a state in which the second part of the first conductor of each of the plurality of electrical fuses is grounded, determining that the cutting processing has been performed on the electrical fuse group if the potential of the second conductor is lower than a reference potential, and determining that the cutting processing has not been performed on the electrical fuse group if the potential of the second conductor is higher than the reference potential.

The determination unit or determination method configured as described above can operate or can be executed in a similar manner to that of detecting a connection state of an antifuse. If such a determination unit or determination method is used, it suffices to use one determination circuit to determine whether the electrical fuse group constituted by a plurality of electrical fuses has been cut, area saving can be realized, and determination accuracy can be improved. By connecting a plurality of fuses in series and using only one determination circuit, an area can be reduced and determination accuracy can be improved. However, if the fuses are electrical fuses, an area of a special transistor for limiting a current path is added so as to individually cut the electrical fuses connected in series. According to the configuration of the present invention, the cutting processing can be performed on a plurality of electrical fuses while the electrical fuses are connected in parallel. Therefore, during the cutting processing on the electrical fuses, a voltage can be applied to each of the electrical fuses independently, and the electrical fuses can be cut independently without having to provide a special transistor or the like.

Furthermore, according to the present invention, there is provided a method of manufacturing a semiconductor device including: selecting a cutting-target electrical fuse; and cutting the cutting-target electrical fuse by the above-described method of cutting the electrical fuse.

According to the present invention, determination accuracy for the electrical fuse can be improved.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 13A and 13B are schematic diagrams showing configurations of a conventional electrical fuse and a conventional determination circuit.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
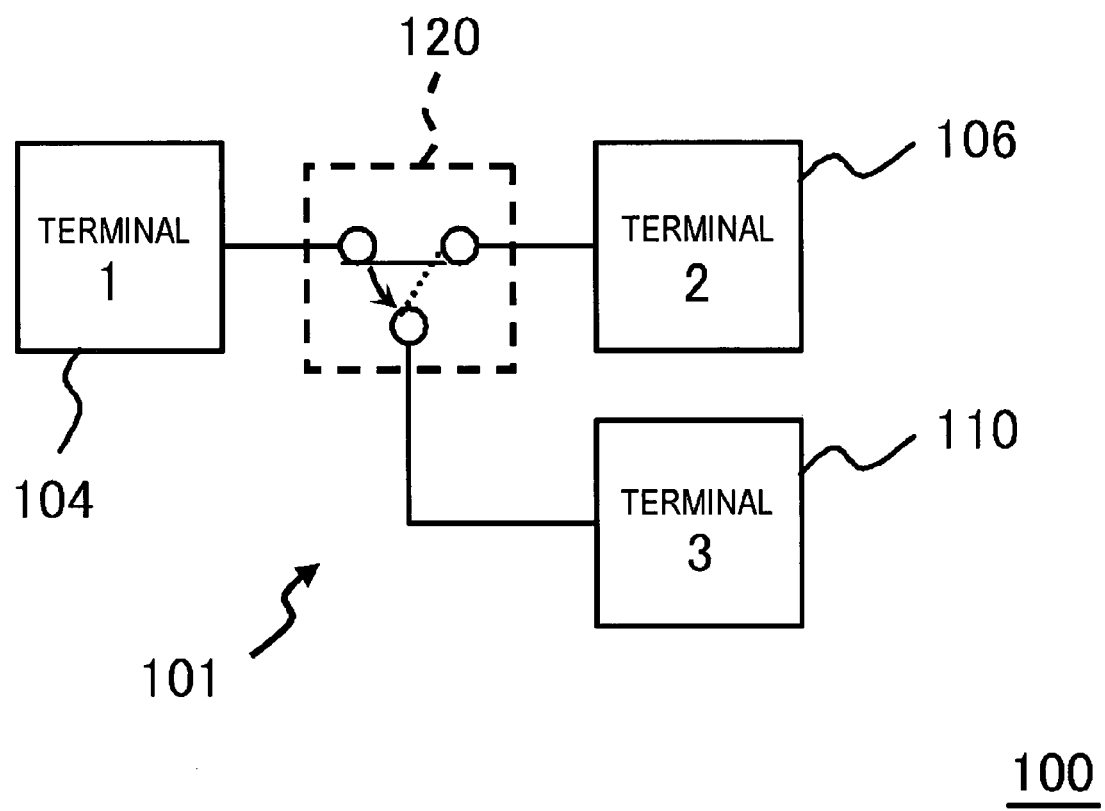
FIG. 1 is a pattern diagram showing an example of a configuration of a semiconductor device according to an embodiment of the present invention.

FIG. 1 is a pattern diagram showing a configuration of a semiconductor device according to an embodiment of the present invention.

A semiconductor device 100 includes an electrical fuse 101 formed on a semiconductor substrate (not shown). The electrical fuse 101 includes a first terminal 104, a second terminal 106, a third terminal 110, and a fuse link 120 composed of a conductor material. The fuse link 120 is electrically connected to the first terminal 104 and the second terminal 106 and electrically disconnected from the third terminal 110 in a state before a cutting processing. The fuse link 120 is electrically connected to the second terminal 106 and the third terminal 110 and electrically disconnected from the first terminal 104 in a state after the cutting processing.

In the embodiment, the fuse link 120 is electrically connected to the second terminal 106 both in the state before the cutting processing and the state after the cutting processing. The fuse link 120 functions as a switch that electrically connects the second terminal 106 to the first terminal 104 in the state before the cutting processing, and that electrically connect the second terminal 106 to the third terminal 110 in the state after the cutting processing.

The inventor has discovered a novel method for cutting an electrical fuse. The method includes forcedly causing a material comprising a part of the electrical fuse to flow outward to destroy the balance between the migration and the supply of the material during the cutting processing on the electrical fuse by controlling a configuration of the electrical fuse, or controlling a mode of applying a voltage to the electrical fuse, or the like, thereby forming a large cutting region in the other part of the electrical fuse. Namely, excessive power is applied to a cutting-target electrical fuse, whereby current is flown through the electrical fuse and the conductor material is heated and expanded. If the conductor material is expanded, cracks or the like are generated in a covering film surrounding the conductor material. Moreover, if the conductor material is expanded, the conductor material is forcedly driven into the cracks of the surrounding covering film. As a result, the balance between the migration and the supply of the conductor material is destroyed, and the large cutting region is formed in a portion different from a portion from which the conductor material flows outward. Hereafter, cutting of the electrical fuse based on this method will be referred to as "crack-assisted fuse cutting".

The crack-assisted fuse cutting can facilitate cutting of the electrical fuse and can keep the electrical fuse in a good cut state. Moreover, by devising the configuration of the electrical fuse, it is possible to selectively provide the portion from which the conductor material flows outward and the portion in which the conductor material is cut. In the embodiment, the cutting processing is performed on the electrical fuse 101 utilizing the crack-assisted fuse cutting.

Figure 2A:
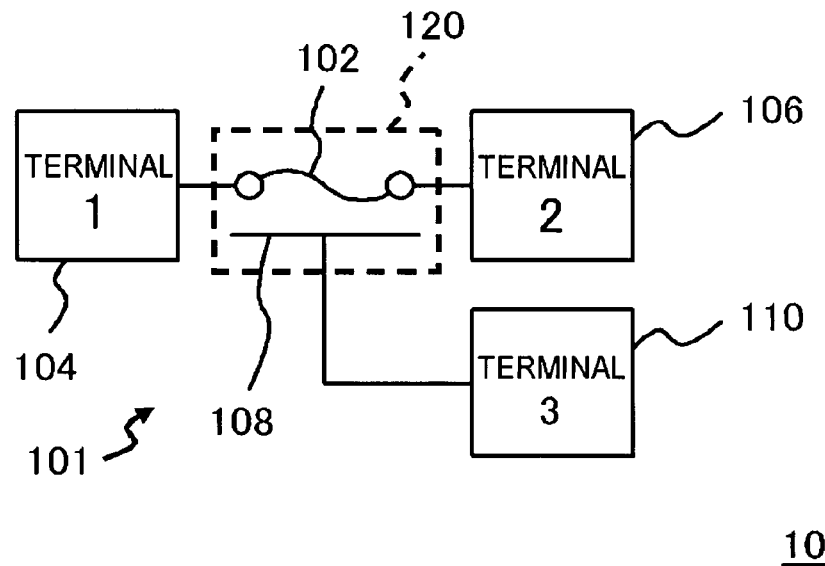
FIGS. 2A and 2B are diagrams schematically showing an electrical fuse shown in FIG. 1.
Figure 2B:
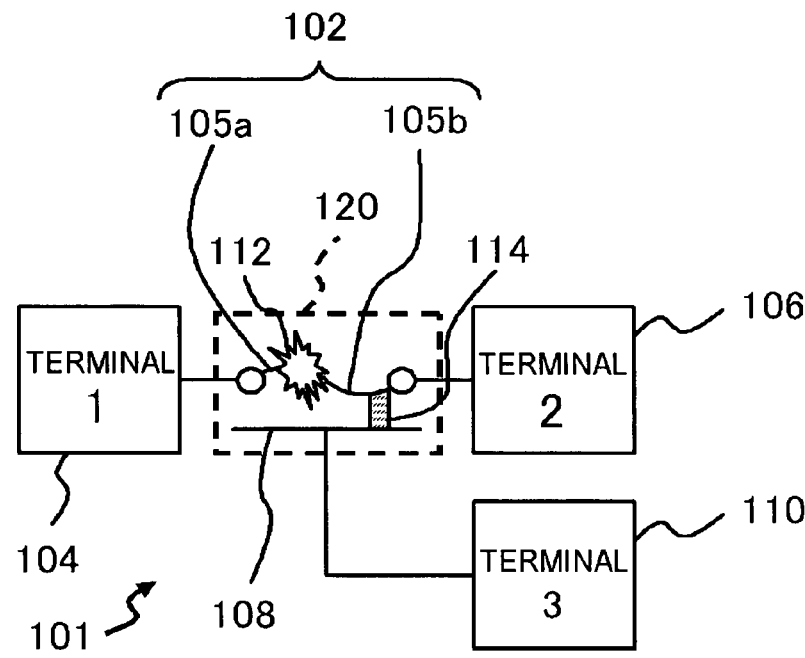

FIGS. 2A and 2B specifically show the electrical fuse 101 shown in FIG. 1.

FIG. 2A shows the state of the electrical fuse 101 before the cutting processing. The fuse link 120 includes a first conductor 102 electrically connecting the first terminal 104 to the second terminal 106, and a second conductor 108 arranged near the first conductor 102, electrically disconnected from the first conductor 102, and electrically connected to the third terminal 110.

FIG. 2B shows the state of the electrical fuse 101 after the cutting processing. In the state after the cutting processing, the first conductor 102 is cut and separated into a first part 105a electrically disconnected from the second conductor 108 and a second part 105b including a flowing region 114 from which a constituent material of the first conductor 102 flows outward and which is electrically connected to the second conductor 108. A cutting portion 112 is formed between the first part 105a and the second part 105b.

In the embodiment, the first conductor 102 is configured so that the conductor material flows outward in a portion near the second terminal 106 to form the flowing region 114, and so that the cutting portion 112 is formed between the first conductor 102 and the first terminal 104.

Figure 3A:
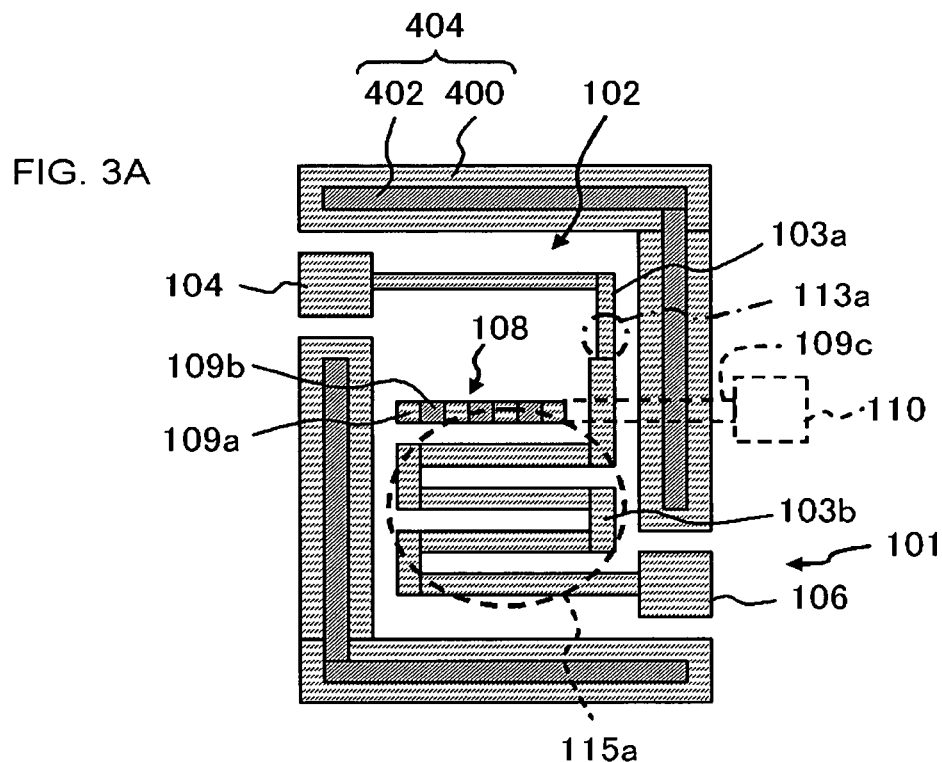
FIGS. 3A and 3B are top plan diagrams showing an example of a specific configuration of a first conductor.
Figure 3B:
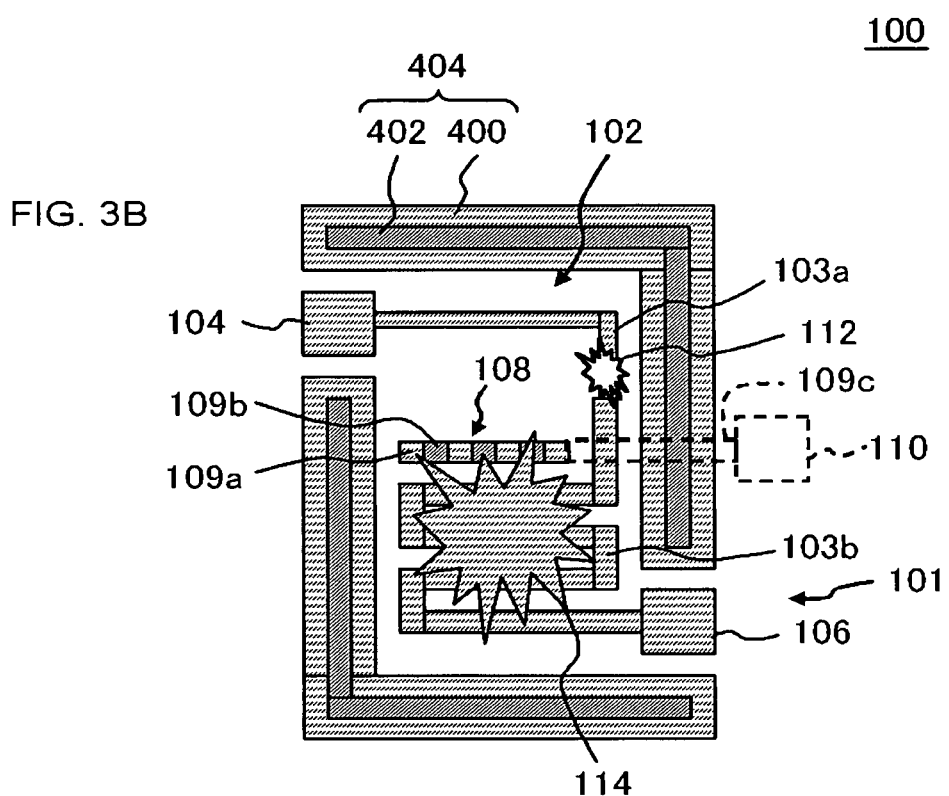

FIGS. 3A and 3B are top plan diagrams showing an example of a specific configuration of the first conductor 102. FIG. 3A shows the state of the electrical fuse 101 before the cutting processing, and FIG. 3B shows the state of the electrical fuse 101 after the cutting processing.

The semiconductor device 100 includes the semiconductor substrate (not shown) and the electrical fuse 101 formed on the semiconductor substrate. In the embodiment, the first conductor 102, the first terminal 104, and the second terminal 106 are formed on the same layer. The first conductor 102 is an interconnect. Each of an interconnect and a via to be described later can be constituted by a copper-based metal film which contains copper as a major component. Furthermore, each of the interconnect and the via can be configured so that at least a sidewall is covered with a barrier metal film.

The first conductor 102 includes a narrow interconnect 103a in a portion connected to the first terminal 104. The narrow interconnect 103a is narrower than a portion connected to the second terminal 106. The first conductor 102 also includes an interconnect-folded structure 103b in the portion connected to the second terminal 106. The folded structure 103b includes a first linear portion connected to the second terminal 106, a second linear portion arranged almost in parallel to the first linear portion, a third linear portion arranged almost in parallel to the second linear portion, a fourth linear portion arranged almost in parallel to the third linear portion, a first connecting portion connecting the first linear portion to the second linear portion, a second connecting portion connecting the second linear portion to the third linear portion, a third connecting portion connecting the third linear portion to the fourth linear portion, and a fourth connecting portion connecting the fourth linear portion to the narrow interconnect 103a.

With the configuration of the first conductor 102, when a current is flown between the first terminal 104 and the second terminal 106, the constituent material of the first conductor 102 tends to be heated in the portion in which the interconnect is wide and folded back. Due to this, the conductor material tends to be thermally expanded in the portion having the folded structure 103b and cracks tend to occur to the portion. Namely, the portion having the folded structure 103b becomes a expected flowing region 115a in which the flowing region 114 is formed when the electrical fuse 101 is subjected to the cutting processing. On the other hand, when the conductor material flows out from the expected flowing region 115a, the supply of the conductor material does not follow in the narrow interconnect 103a, so that the narrow interconnect 103a tends to be cut. Due to this, the narrow interconnect 103a becomes an expected cutting region 113a in which the cutting portion 112 is formed when the electrical fuse 101 is subjected to the cutting processing.

Furthermore, the second conductor 108 is arranged near the folded structure 103b of the first conductor 102. The second conductor 108 includes an interconnect 109a formed on the same layer as that on which the first conductor 102 is formed, an interconnect 109c formed on the other layer, and a via 109b connecting the interconnect 109a to the interconnect 109c. The interconnect 109c and the third terminal 110 are formed on the same layer. The interconnect 109a is electrically disconnected from the first conductor 102 in the state before the cutting processing, and arranged at a position in contact with the flowing region 114 of the first conductor 102 in the state after the cutting processing.

Moreover, the semiconductor device 100 is configured so that a top, a bottom, and a side of the electrical fuse 101 are covered with a cover member 404. The cover member 404 is configured to include a via 402, an electrode 400, and a plate (not shown). The electrode 400 can be formed as a pad electrode formed on the same layers as that on which the first conductor 102 of the electrical fuse 101 is formed. The via 402 is formed in each of an upper layer and a lower layer of the electrode 400, and connects the plate (not shown) formed on each of the upper and lower layers to the electrode 400. The via 402 can be formed as a slit via and configured so that the electrical fuse 101 is surrounded by the via 402 and the electrode 400 in the form of a wall. By so configuring, if a current is flown between the first terminal 104 and the second terminal 106, the heat generated in the first conductor 102 can be reflected by the cover member 404 and confined within the cover member 404. This can facilitate forming the flowing region 114 and the cutting portion 112 in the electrical fuse 101. Further, the cover member 404 can block the constituent material of the first conductor 102 from scattering around the electrical fuse 101 when the first conductor 102 is cut. It is thereby possible to prevent scattering pieces of the constituent material of the first conductor 102 from reaching the other elements.

In the above-described configuration, the narrow interconnect 103a corresponds to the first part 105a and the folded structure 103b corresponds to the second part, 105b. By using the electrical fuse 101 configured as described above, when the first conductor 102 is cut, the second part 105b electrically connected to the second conductor 108 and the first part 105a electrically disconnected from the second conductor 108 can be selectively arranged. It is thereby possible to determine whether the electrical fuse 101 has been cut in various manners using the three terminals of the first terminal 104, the second terminal 106, and the third terminal 110. In the subsequent embodiments, the electrical fuse 101 can be configured as described with reference to FIGS. 3A and 3B.

(First Embodiment)

Figure 4:
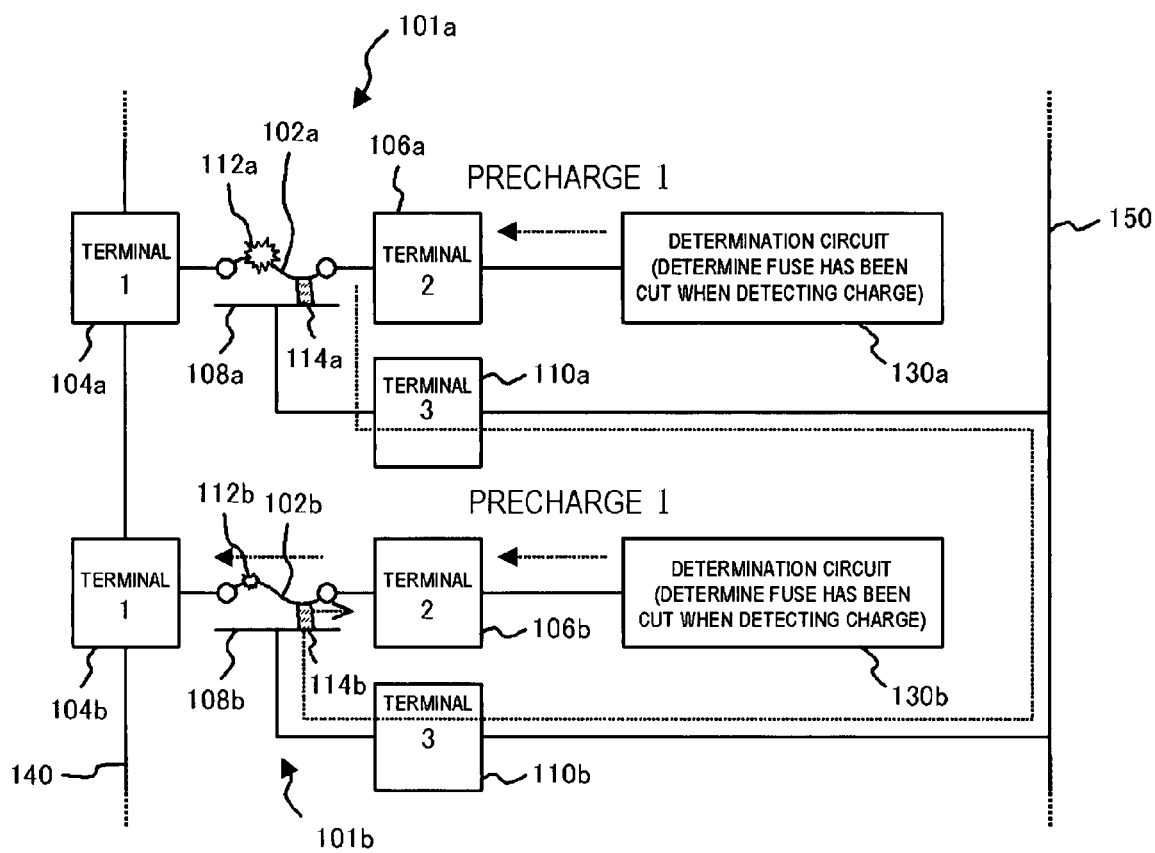
FIG. 4 is a pattern diagram showing a configuration of a semiconductor device according to an embodiment of the present invention.

FIG. 4 is a pattern diagram showing a configuration of a semiconductor device 100 according to the present embodiment. FIG. 4 shows a state after a cutting processing.

In the embodiment, the semiconductor device 100 is configured so that a plurality of electrical fuses 101 is formed on a semiconductor substrate (not shown). For description purposes, the electrical fuses 101 are denoted by 101a and 101b. The electrical fuses 101a and 101b are similar in configuration to the electrical fuse 101. Although not shown in FIG. 4, a portion of a first conductor 102a connected to a first terminal 104a and a portion of the first conductor 102a connected to a second terminal 106a correspond to the first part 105a and the second part 105b shown in FIG. 2B, respectively. The same thing holds true for a first conductor 102b.

First terminals 104a and 104b of the electrical fuses 101a and 101b are connected to each other by a first common interconnect 140. Third terminals 110a and 110b of the electrical fuses 101a and 101b are connected to each other by a second common interconnect 150. Namely, the third terminals 110a and 110b are equal in potential.

The semiconductor device 100 also includes a plurality of determination circuits, that is, determination circuits 130a and 130b provided to correspond to the respective electrical fuses 101a and 101b. The determination circuit 130a applies a predetermined potential to a second terminal 106a and detects a potential of the second terminal 106a in a state in which the first terminal 104a is grounded. If the potential of the second terminal 106a is higher than a reference potential, the determination circuit 130a determines that a cutting processing has been performed on the electrical fuse 101a. If the potential of the second terminal 106a is lower than the reference potential, the determination circuit 130a determines that the cutting processing has not been performed on the electrical fuse 101a. The first terminal 104a is grounded by grounding the first common interconnect 140. In the similar manner, the determination circuit 130b determines whether or not a cutting processing has been performed on the electrical fuse 101b.

Procedures for determining whether the cutting processing has been performed on the electrical fuse 101b in the semiconductor device 100 configured as described above will be described.

At the time of a determination, the first common interconnect 140 is grounded. In the electrical fuse 101a, the predetermined potential is applied to the second terminal 106a from the determination circuit 130a. In the electrical fuse 101b, the predetermined potential is applied to the second terminal 106b from the determination circuit 130b. According to the conventional techniques, if a cutting portion 112b is insufficiently cut and has a low resistance, the potential of the second terminal 106b is lowered. As a result, although the cutting processing has been performed on the electrical fuse 101b, it is possibly erroneously determined that the cutting processing has not been performed on the electrical fuse 101b.

On the other hand, if a cutting portion 112a is sufficiently cut in the electrical fuse 101a, the potential of the second terminal 106a of the electrical fuse 101a is higher to the extent that it can be correctly detected. Furthermore, the potential of the third terminal 110a electrically connected to the second terminal 106a is equal to that of the second terminal 106a. With the configuration according to the embodiment, the third terminals 110a and 110b are connected to each other by the second common interconnect 150. Due to this, the potential of the third terminal 110b is increased by the potential of the third terminal 110a. Because the third terminal 110b is electrically connected to the second terminal 106b, the potential of the second terminal 106b can be increased to the extent that it can be correctly detected. While only two electrical fuses are shown in FIG. 4, the semiconductor 100 can include more than two electrical fuses. Generally, the cutting processing is performed under conditions that the electrical fuse is sufficiently cut. Due to this, a percentage of the presence of electrical fuses in which the cutting portion 112b are insufficiently cut as described above with reference to the electrical fuse 101b is quite low. Therefore, by connecting third terminals 110 of many electrical fuses to one another by the second common interconnect 150, it is possible to stably keep potentials of second terminals 106 high in all the electrical fuses that have been subjected to the cutting processing.

On the other hand, if the cutting processing has not been performed on the electrical fuse, the second conductor 108a (or the second conductor 108b) is not electrically connected to the first conductor 102a (or the first conductor 102b). Due to this, even if the third terminals (110a and 110b) of all the electrical fuses are connected to each other by the second common interconnect 150, no influence is given to the second terminal (106a or 106b) of the electrical fuse on which the cutting processing has not been performed. In this way, with the configuration according to the embodiment, if the cutting processing has been performed on one of the electrical fuses, it is possible to improve determination accuracy using increase in potential by the other electrical fuse. If the cutting processing has not been performed on any electrical fuses, the determination can be made according to the conventional determination method. It is thereby possible to improve the determination accuracy as a whole.

(Second Embodiment)

Figure 5:
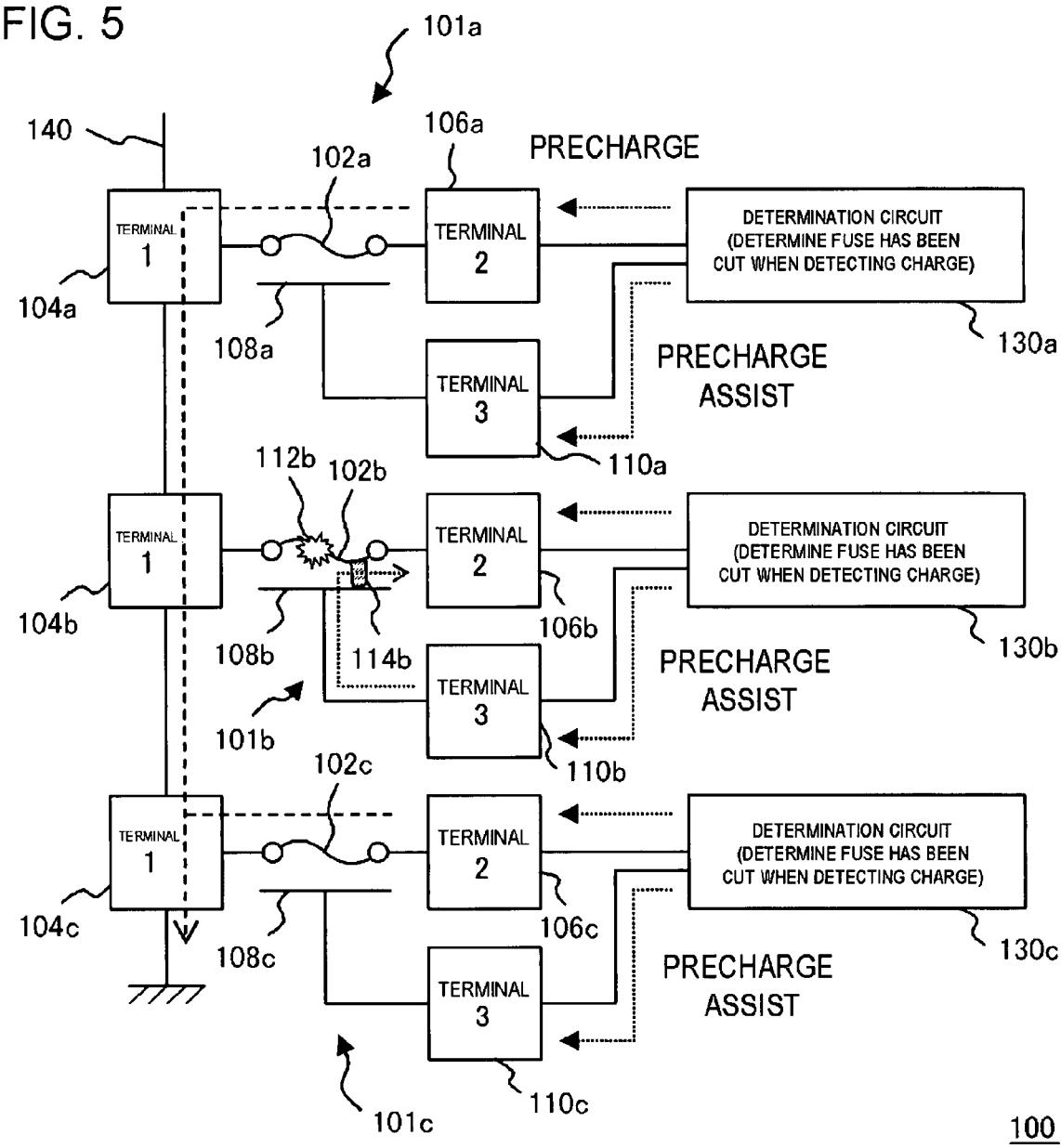
FIG. 5 is a pattern diagram showing a configuration of a semiconductor device according to an embodiment of the present invention.

FIG. 5 is a pattern diagram showing a configuration of a semiconductor device 100 according to the present embodiment. FIG. 5 shows a state after a cutting processing.

In the embodiment, the semiconductor device 100 is configured so that a plurality of electrical fuses 101 is formed on a semiconductor substrate (not shown). For description purposes, the electrical fuses 101, are denoted by 101a, 101b, and 101c. The electrical fuses 101a, 101b, and 101c are similar in configuration to the electrical fuse 101. While only three electrical fuses are shown in FIG. 5, the semiconductor device 100 may include more than three electrical fuses. Although not shown in FIG. 5, a portion of a first conductor 102a connected to a first terminal 104a and a portion of the first conductor 102a connected to a second terminal 106a correspond to the first part 105a and the second part 105b shown in FIG. 2B, respectively. The same thing holds true for a first conductor 102c and a first conductor 102b.

First terminals 104a, 104b, and 104c of the electrical fuses 101a, 101b, and 101c are connected to one another by a first common interconnect 140.

The semiconductor device 100 also includes a plurality of determination circuits (determination unit and potential application units), that is, determination circuits 130a, 130b, and 130c provided to correspond to the respective electrical fuses 101a, 101b, and 101c. The determination circuit 130a applies a predetermined potential to a second terminal 106a, and detects a potential of the second terminal 106a in a state in which the first terminal 104a is grounded. If the potential of the second terminal 106a is higher than a reference potential, the determination circuit 130a determines that a cutting processing has been performed on the electrical fuse 101a. If the potential of the second terminal 106a is lower than the reference potential, the determination circuit 130a determines that the cutting processing has not been performed on the electrical fuse 101a. In the second embodiment, the determination circuit 130a also applies a predetermined potential to a third terminal 110a. The second embodiment differs from the first embodiment in this respect. The determination circuits 130b and 130c are similar in configuration to the determination circuit 130a, and determine whether or not a cutting processing has been performed on the electrical fuses 101b and 101c.

Procedures for determining whether the cutting processing has been performed on each of the electrical fuses 101a to 101c in the semiconductor device 100 configured as described above will be described.

Procedures for determining whether the electrical fuse 101b that has been subjected to the cutting processing has been cut will first be described. At the time of a determination, the first common interconnect 140 is grounded. In the electrical fuse 101b, the predetermined potentials are applied to the second terminal 106b and the third terminal 110b from the determination circuit 130b. According to the conventional techniques, if a cutting portion 112b is insufficiently cut and has a low resistance, the potential of the second terminal 106b is lowered. As a result, although the cutting processing has been performed on the electrical fuse 101b, it is possibly erroneously determined that the cutting processing has not been performed on the electrical fuse 101b.

With the configuration according to the embodiment, by contrast, the predetermined potential is also applied to the third terminal 110b. Because the third terminal 110b is electrically connected to the second terminal 106b, the potential applied to the third terminal 110b is also held by the second terminal 106b. Therefore, the potential held by the second terminal 106b can be increased. It is thereby possible to reduce the number of erroneous determinations if the cutting processing has been performed on the cutting-target electrical fuse.

Procedures for determining whether the electrical fuse 101a that has not been subjected to the cutting processing has been cut will next be described. The procedures are similar to those for the electrical fuse 101b. If the cutting processing has not been performed on the electrical fuse 101a, a second conductor 108a is not electrically connected to the first conductor 102a. Due to this, even if the determination circuit 130a applies the predetermined potential to the third terminal 110a, no influence is given to the second terminal 106a. In this way, with the configuration according to the embodiment, if the cutting processing has been performed on one of the electrical fuses, it is possible to improve determination accuracy using increase in the potential applied to the third terminal 110. If the cutting processing has not been performed on any electrical fuses, the determination can be made according to the conventional determination method. It is thereby possible to improve the determination accuracy as a whole.

(Third Embodiment)

Figure 6:
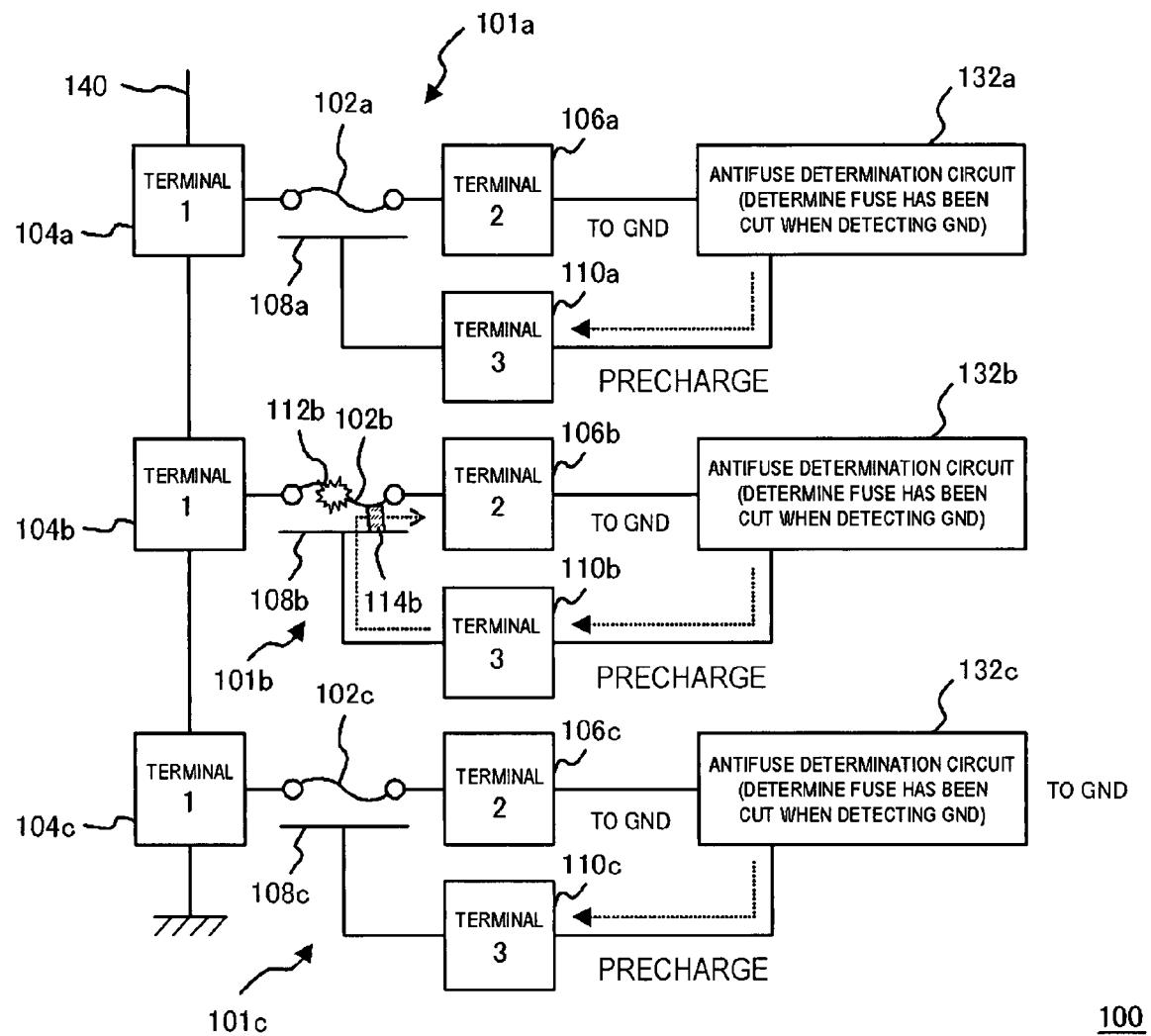
FIG. 6 is a pattern diagram showing a configuration of a semiconductor device according to an embodiment of the present invention.

FIG. 6 is a pattern diagram showing a configuration of a semiconductor device 100 according to the present embodiment. FIG. 6 shows a state after a cutting processing.

The embodiment differs from the first and second embodiments in that it is determined whether a cutting processing has been performed on an electrical fuse 101 in a manner similar to that of detecting a connection state of an antifuse. Namely, in the embodiment, if a third terminal 110 is electrically connected to a second terminal 106, it is determined that a cutting processing has been performed on the electrical fuse 101. If the third terminal 110 is not electrically connected to the second terminal 106, it is determined that a cutting processing has not been performed on the electrical fuse 101.

In the embodiment, the semiconductor device 100 is configured so that a plurality of electrical fuses 101 is formed on a semiconductor substrate (not shown). For description purposes, the electrical fuses 101 are denoted by 101a, 101b, and 101c. The electrical fuses 101a, 101b, and 101c are similar in configuration to the electrical fuse 101. While only three electrical fuses are shown in FIG. 6, the semiconductor device 100 can include more than three electrical fuses. Although not shown in FIG. 6, a portion of a first conductor 102a connected to a first terminal 104a and a portion of the first conductor 102a connected to a second terminal 106a correspond to the first part 105a and the second part 105b shown in FIG. 2B, respectively. The same thing holds true for a first conductor 102b and a first conductor 102c.

First terminals 104a, 104b, and 104c of the electrical fuses 101a, 101b, and 101c are connected to one another by a first common interconnect 140.

The semiconductor device 100 also includes a plurality of determination circuits, that is, determination circuits 132a, 132b, and 132c provided to correspond to the respective electrical fuses 101a, 101b, and 101c. The determination circuit 132a applies a predetermined potential to a second conductor 108a and detects a potential of the second conductor 108a in a state in which the second terminal 106a is grounded. If the potential of the second conductor 108a is lower than a reference potential, the determination circuit 132a determines that a cutting processing has been performed on the electrical fuse 101a. If the potential of the second conductor 108a is higher than the reference potential, the determination circuit 132a determines that the cutting processing has not been performed on the electrical fuse 101a. The first terminal 104a is grounded by grounding the first common interconnect 140. The determination circuits 132b and 132c are similar in configuration to the determination circuit 132a, and determine whether or not a cutting processing has been performed on the electrical fuses 101b and 101c.

At the time of determining whether the cutting processing has been performed on the electrical fuse 101 as described above, if the cutting processing has been performed on the electrical fuse 101 but the first conductor 102 is not cut, then the third terminal 110 is electrically connected to the first terminal 104, and an unintended current path is generated as shown in FIG. 13. As a result, it is impossible to correctly determine whether the cutting processing has been performed on the electrical fuse 101. In the embodiment, the semiconductor device 100 is configured so as to ensure a cutting of the first conductor 102 if the cutting processing is performed on the electrical fuse 101. It is, therefore, possible to prevent occurrence of the unintended current path as shown in FIG. 13, and improve determination accuracy.

(Fourth Embodiment)

Figure 7:
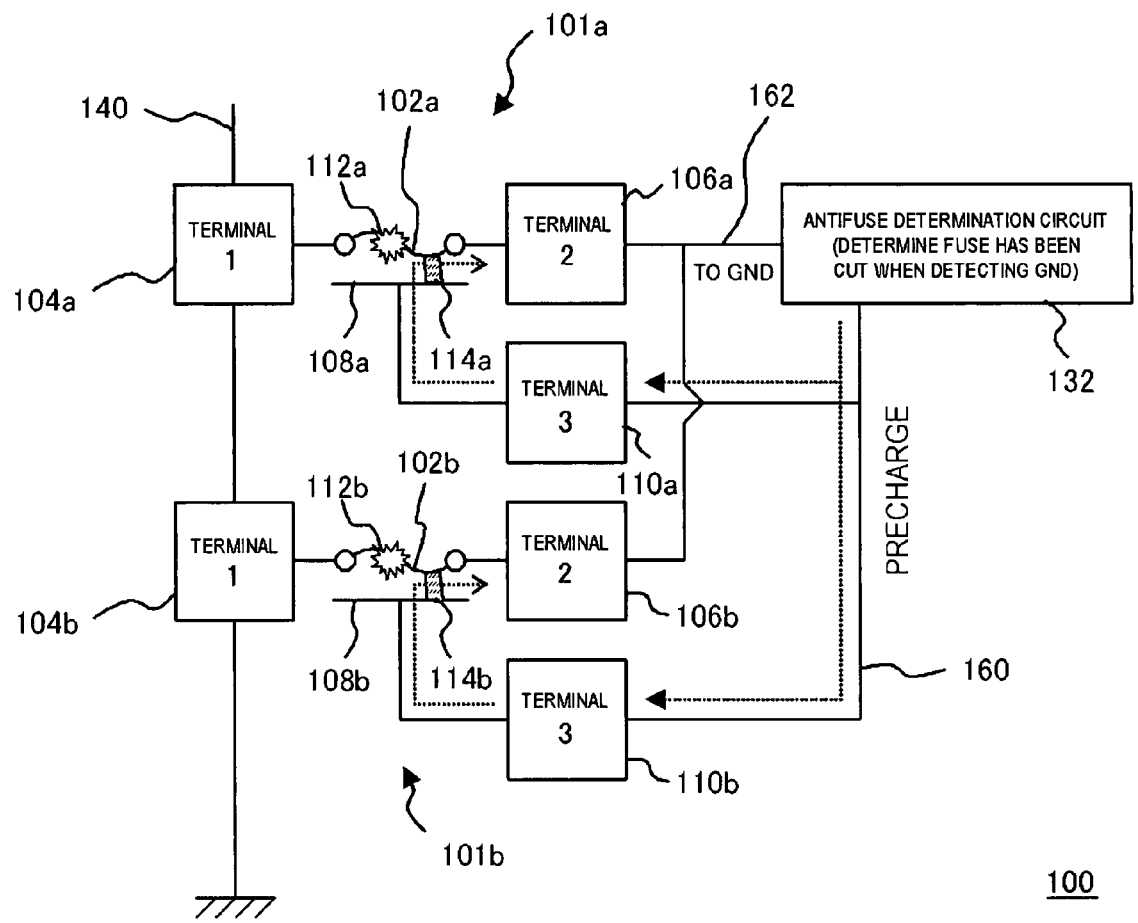
FIG. 7 is a pattern diagram showing a configuration of a semiconductor device according to an embodiment of the present invention.

FIG. 7 is a pattern diagram showing a configuration of a semiconductor device 100 according to the present embodiment. FIG. 7 shows a state after a cutting processing.

The embodiment is similar to the third embodiment in that it is determined whether a cutting processing has been performed on an electrical fuse 101 in a manner similar to that of detecting a connection state of an antifuse. However, the embodiment differs from the third embodiment in that one determination circuit 132 is provided in a plurality of electrical fuses 101a and 101b in common. In the embodiment, the determination circuit 132 determines whether a cutting processing has been performed on an electrical fuse group including the electrical fuses 101a and 101b. If it is detected that the cutting processing has been performed on at least one of the electrical fuses 101a and 101b, the determination circuit 132 determines that the cutting processing has been performed on the electrical fuse group. By doing so, even if a cutting processing has been insufficiently performed on one of the electrical fuses and a third terminal 110 is not electrically connected to a second terminal 106 by the presence of a flowing region 114, or even if one of the electrical fuses is cut although it is connected once, the determination circuit 132 can determine that the cutting processing has been performed on the electrical fuse group as long as the determination circuit 132 correctly determines that the cutting processing has been performed on the other electrical fuse. Therefore, it is possible to greatly improve determination accuracy.

In the embodiment, the semiconductor device 100 is configured so that a plurality of electrical fuses 101 is formed on a semiconductor substrate (not shown). For description purposes, the electrical fuses 101 are denoted by 101a and 101b. The electrical fuses 101a and 101b are similar in configuration to the electrical fuse 101. Although not shown in FIG. 7, a portion of a first conductor 102a connected to a first terminal 104a and a portion of the first conductor 102a connected to a second terminal 106a correspond to the first part 105a and the second part 105b shown in FIG. 2B, respectively. The same thing holds true for a first conductor 102b.

First terminals 104a and 104b are connected to each other by a first common interconnect 140. Third terminals 110a and 110b are connected to each other by a connection interconnect 160. Furthermore, second terminals 106a and 106b are connected to each other by a connection interconnect 162.

The semiconductor device 100 also includes the determination circuit 132. The determination circuit 132 applies a predetermined potential to the third terminals 110a and 110b via the connection interconnect 160 and detect a potential of the connection interconnect 160 in a state in which the second terminals 106a and 106b are grounded. If the potential of the connection interconnect 160 is lower than a reference potential, the determination circuit 132 determines that a cutting processing has been performed on the electrical fuse group. If the potential of the connection interconnect 160 is higher than the reference potential, the determination circuit 132 determines that a cutting processing has not been performed on the electrical fuse group.

With the configuration shown in FIG. 7, if the cutting processing is to be performed on the electrical fuses 101a and 101b included in the electrical fuse group, then a voltage is applied to the first common interconnect 140, and selection is made by a transistor or the like (not shown) so as to ground the connection interconnect 162. It is thereby possible to simultaneously apply voltage between the first terminal 104a and the second terminal 106a and between the first terminal 104b and the second terminal 106b. Accordingly, a cutting portion 112a and a flowing region 114a can be formed in the first conductor 102a, and a cutting portion 112b and a flowing region 114b can be formed in the first conductor 102b.

At the time of determining whether the cutting processing has been performed on the electrical fuse group, the determination circuit 132 applies a predetermined potential to the connection interconnect 160, thereby simultaneously applying a predetermined potential to the third terminals 110a and 110b via the connection interconnect 160. At the same time, the connection interconnect 162 is grounded. By doing so, if the cutting portion 112 and the flowing region 114 are formed in one of the first conductors 102a and 102b, then current is flown from the connection interconnect 160 to the connection interconnect 162, and the potential of the connection interconnect 160 becomes equal to a ground potential. If the potential of the connection interconnect 160 becomes equal to the ground potential, the determination circuit 132 can determine that the cutting processing has been performed on the electrical fuse group. It is thereby possible to improve determination accuracy.

In the semiconductor device 100 according to the embodiment, it is determined whether a cutting processing has been performed on a plurality of electrical fuses arranged in parallel in the similar manner to the antifuse. Moreover, the parts (third terminals) to which the potential is applied for the determination are connected in common. Therefore, it is possible to determine whether the electrical fuse group has been cut based on the potential of the commonly connected portion. Due to this, it suffices to use one determination circuit to determine whether the electrical fuse group constituted by a plurality of electrical fuses has been cut, and area saving can be realized. By connecting a plurality of fuses in series and using only one determination circuit, an area can be reduced and determination accuracy can be improved. However, if the fuses are electrical fuses, an area of a special transistor for limiting a current path is added so as to individually cut the electrical fuses connected in series. With the configuration according to the embodiment, by contrast, the cutting processing can be performed on a plurality of electrical fuses while the electrical fuses are connected in parallel. Therefore, during the cutting processing on the electrical fuses, a voltage can be applied to each of the electrical fuses independently, and the electrical fuses can be cut independently without having to provide a special transistor or the like.

In the embodiment, only two electrical fuses are shown. However, the semiconductor device 100 can be configured to include more than two electrical fuses. In this case, the first terminals 104 of these many electrical fuses are connected to one another by the first common interconnect 140, the second terminals 106 thereof are connected to one another by the connection interconnect 162, and the third terminal 110 thereof are connected to one another by the connection interconnect 160. It is thereby possible to further improve the determination accuracy.

The embodiments of the present invention have been described so far with reference to the drawings. However, the embodiments are given only for illustrative purposes and various other configurations can be adopted.

In the embodiments, the configuration in which the expected cutting region 113a is provided in the narrow interconnect 103a as the configuration in which the first conductor 102 includes the narrow interconnect 103a. As an alternative, the semiconductor device 100 can be configured so that the first conductor 102 is constituted by interconnects and a via so that the expected cutting region 113a is formed in the via. The alternative embodiment will be described below with reference to FIGS. 8A, 8B, 9A, and 9B.

Figure 8A:
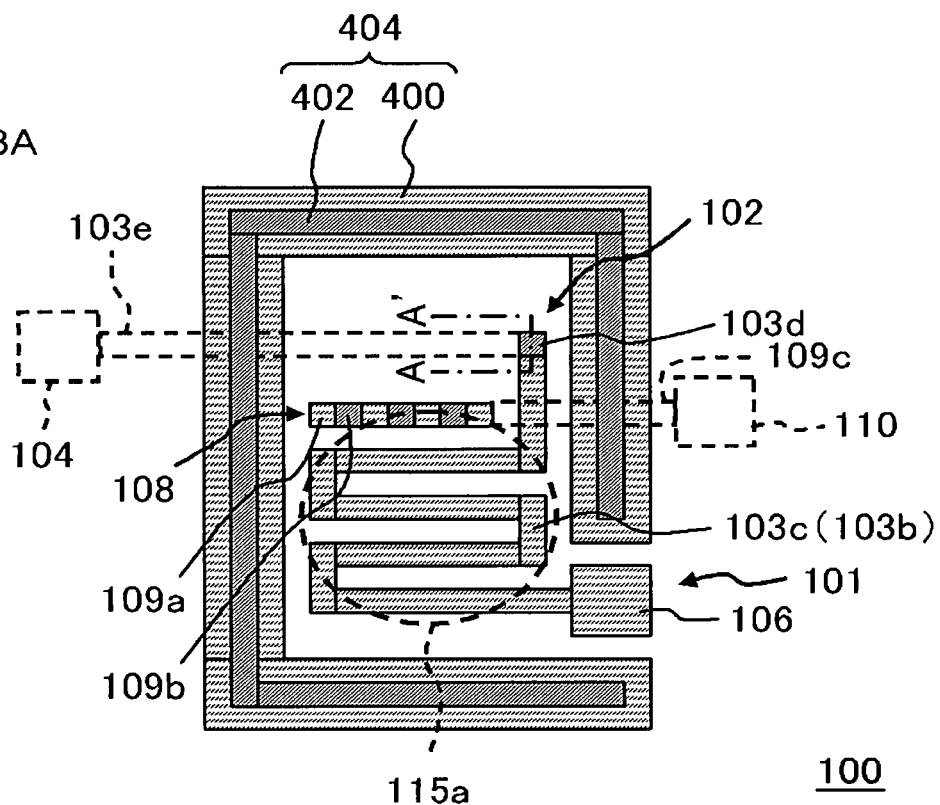
FIGS. 8A and 8B are top plan diagrams showing an example of a specific configuration of a first conductor.
Figure 8B:
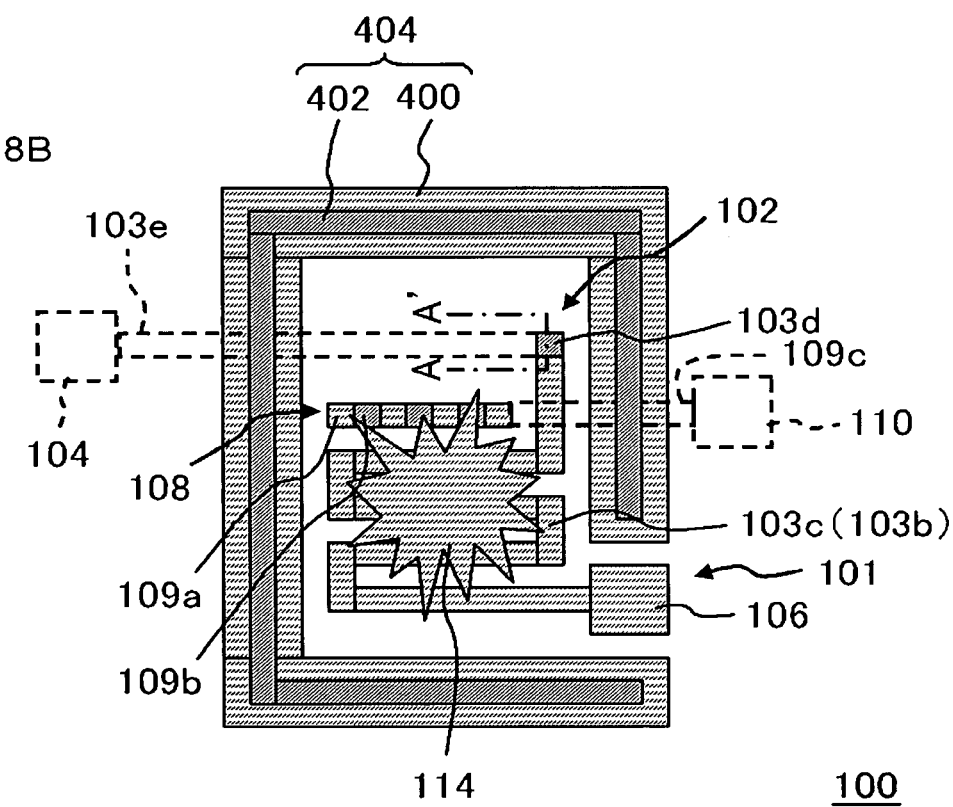

FIGS. 8A and 8B are top plan diagrams showing a configuration of an electrical fuse 101. FIG. 8A shows a state before a cutting processing, and FIG. 8B shows a state after the cutting processing.

A semiconductor device 100 includes a semiconductor substrate (not shown) and the electrical fuse 101 formed on the semiconductor substrate. In the embodiment, a first terminal 104 and a second terminal 106 are formed on different layers. The first conductor 102 includes a first interconnect 103c formed on the same layer as that on which the second terminal 106 is formed, a second interconnect 103e formed on the same layer as that on which the first terminal 104 is formed, and a via 103d connecting the first interconnect 103c to the second interconnect 103e.

The interconnect 103c includes an interconnect-folded structure 103b in the portion connected to the second terminal 106. The folded structure 103b includes a first linear portion connected to the second terminal 106, a second linear portion arranged almost in parallel to the first linear portion, a third linear portion arranged almost in parallel to the second linear portion, a fourth linear portion arranged almost in parallel to the third linear portion, a first connecting portion connecting the first linear portion to the second linear portion, a second connecting portion connecting the second linear portion to the third linear portion, a third connecting portion connecting the third linear portion to the fourth linear portion, and a fourth connecting portion connecting the fourth linear portion to the via 103d.

With the configuration of the first conductor 102, when a current is flown between the first terminal 104 and the second terminal 106, the constituent material of the first conductor 102 tends to be heated. At this time, the conductor material tends to be heated in the portion in which the interconnect is wide and folded back. Due to this, the conductor material tends to be thermally expanded in the portion having the folded structure 103b and cracks tend to occur to the portion. Namely, the portion having the folded structure 103b becomes a expected flowing region 115a in which a flowing region 114 is formed when the electrical fuse 101 is subjected to the cutting processing. On the other hand, when the conductor material flows out from the expected flowing region 115a, the supply of the conductor material does not follow in the via 103d, so that the via 103d tends to be cut. Due to this, the via 103d becomes an expected cutting region in which a cutting portion 112 is formed when the electrical fuse 101 is subjected to the cutting processing.

Furthermore, the second conductor 108 is arranged near the folded structure 103b of the first conductor 102. The second conductor 108 includes an interconnect 109a formed on the same layer on which the first interconnect 103c is formed, an interconnect 109c formed on the other layer, and a via 109b connecting the interconnect 109a to the interconnect 109c. The interconnect 109c and the third terminal 110 are formed on the same layer. The first terminal 104 and the third terminal 110 may be provided either on the same layer or different layers. The interconnect 109a is electrically disconnected from the first conductor 102 in the state before the cutting processing, and arranged at a position in contact with the flowing region 114 of the first conductor 102 in the state after the cutting processing.

Moreover, the semiconductor device 100 is configured so that a top, a bottom, and a side of the electrical fuse 101 are covered with a cover member 404. The cover member 404 is similar in configuration to that in the semiconductor device 100 shown in FIGS. 3A and 3B.

Figure 9A:
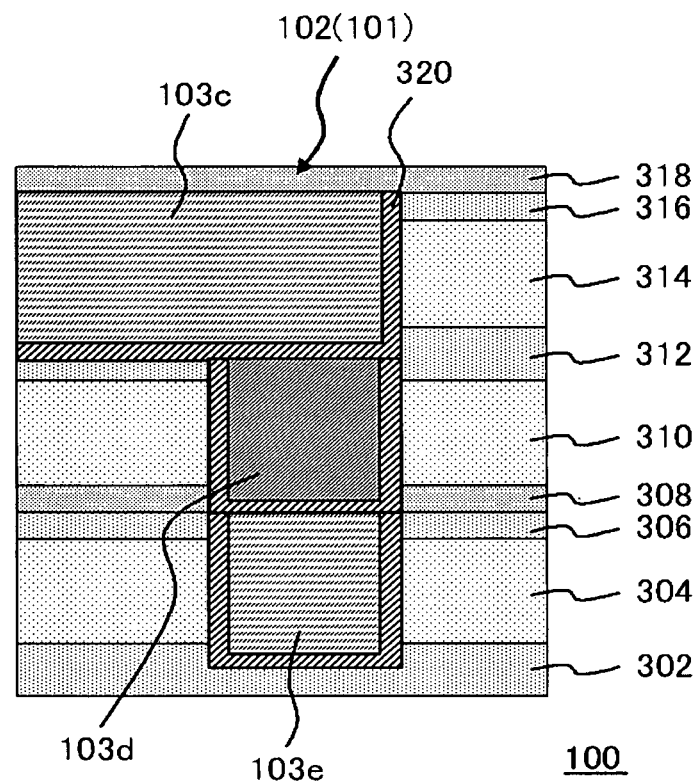
FIGS. 9A and 9B are cross-sectional views showing an example of the specific configuration of the first conductor.
Figure 9B:
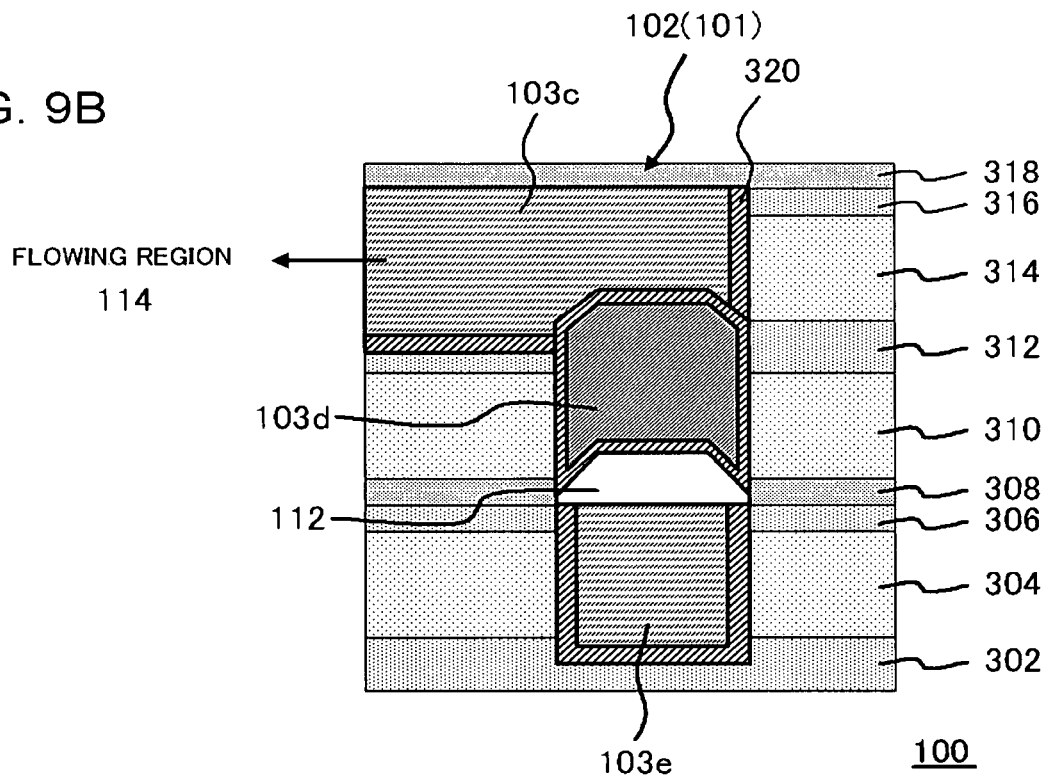
Figure 10:
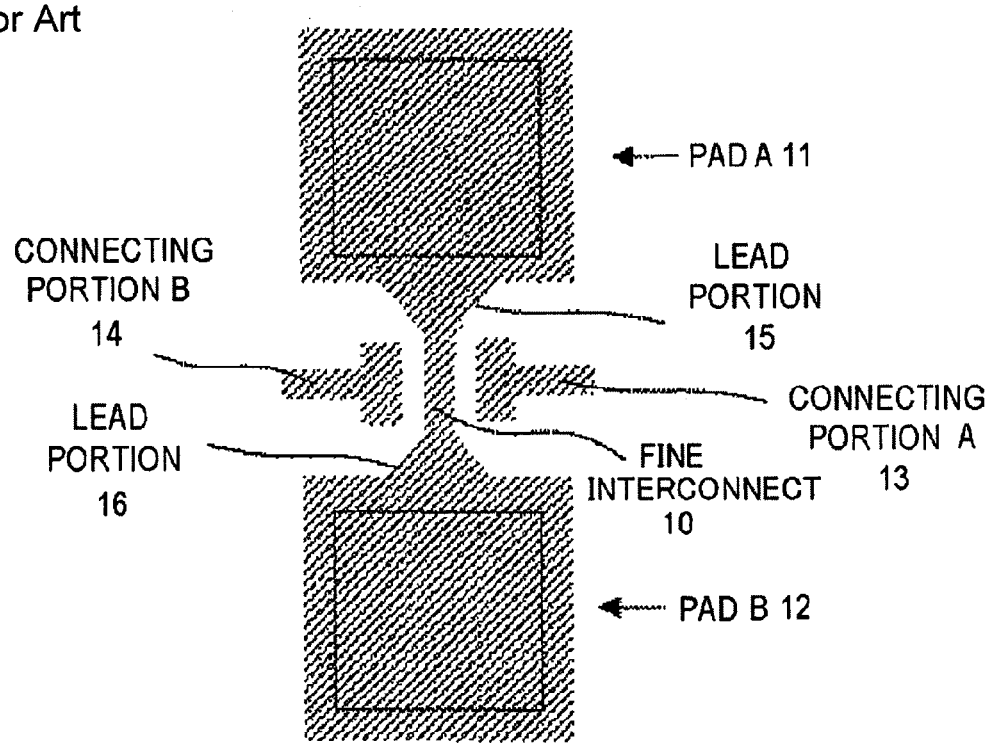
FIG. 10 is a schematic plan view of a conventional trimming pattern.
Figure 11:
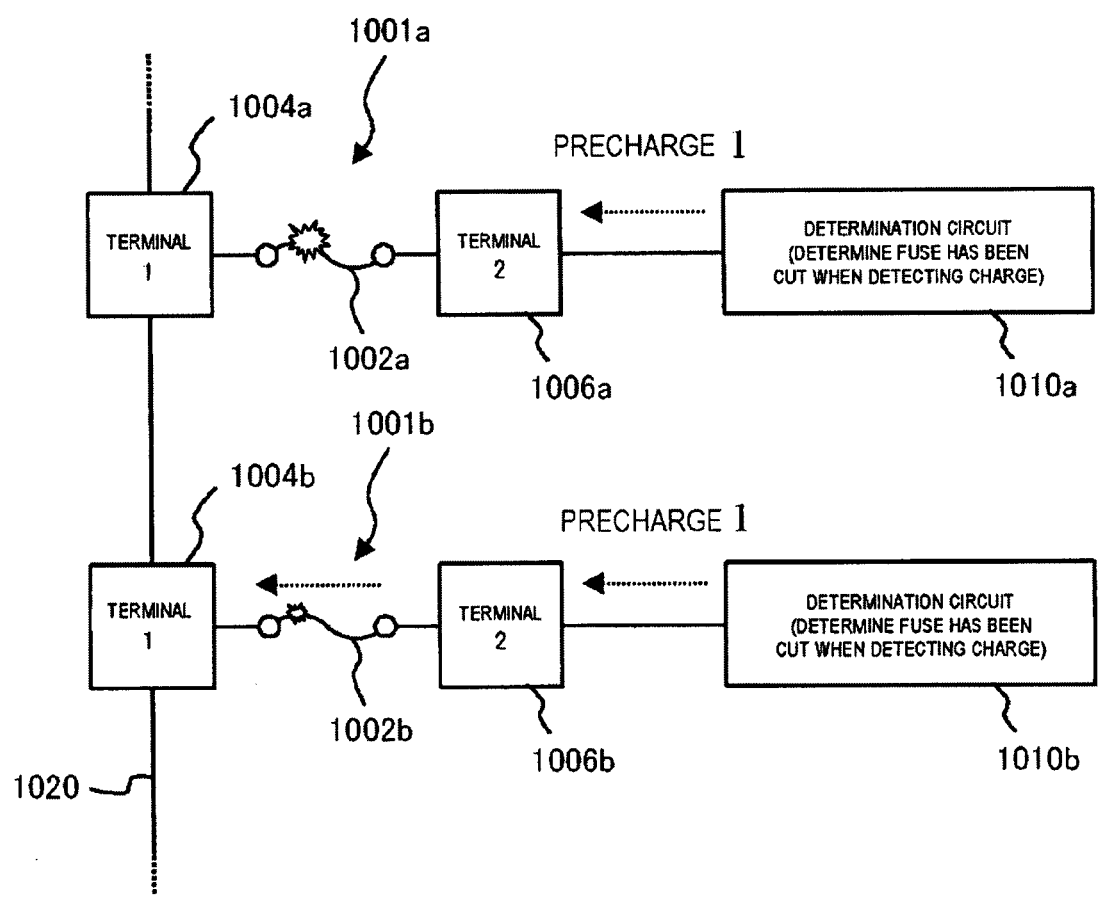
FIG. 11 is a schematic diagram showing configurations of a conventional electrical fuse and a conventional determination circuit.
Figure 12:
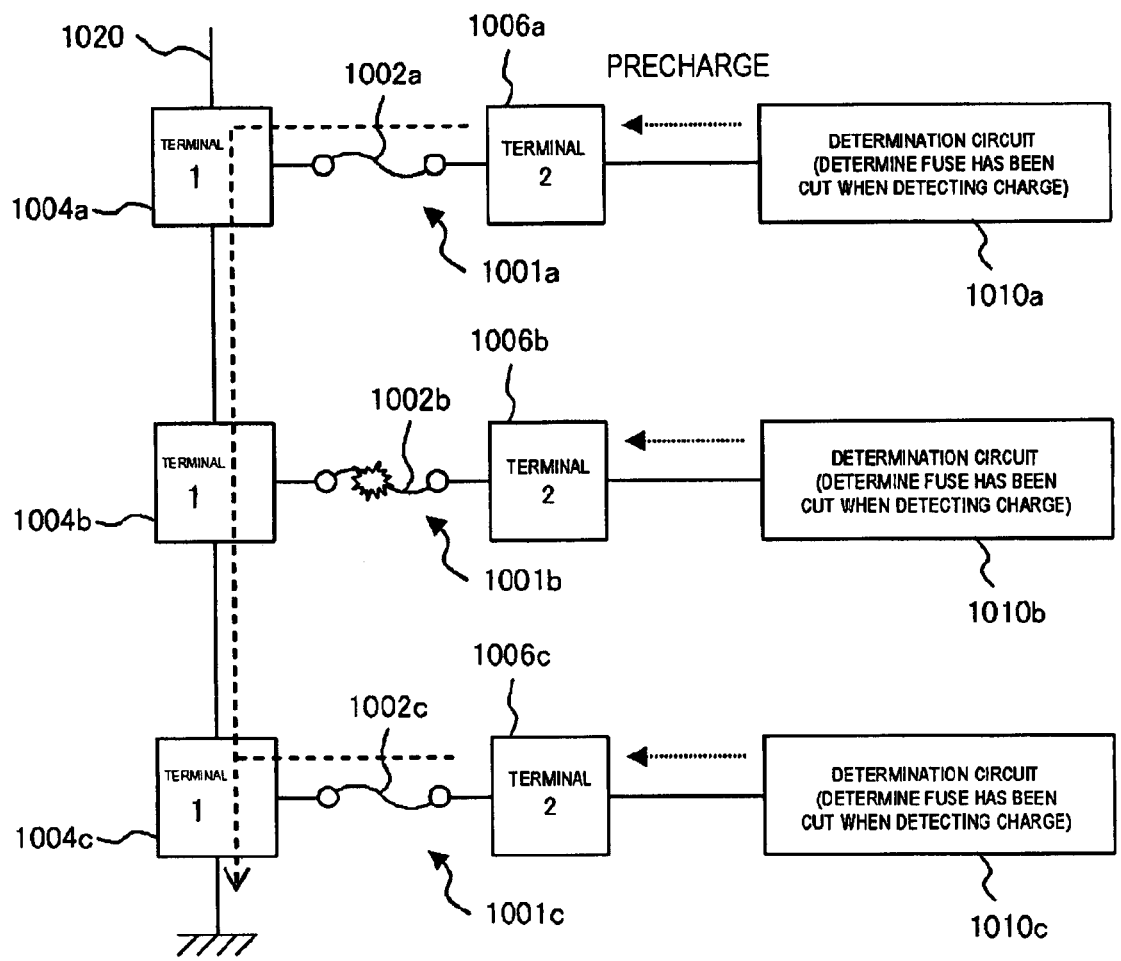
FIG. 12 is a schematic diagram showing configurations of a conventional electrical fuse and a conventional determination circuit.

FIGS. 9A and 9B are cross-sectional views taken along lines A-A' of FIGS. 8A and 8B, respectively. FIG. 9A shows the state before the cutting processing and FIG. 9B shows the state after the cutting processing. While FIGS. 9A and 9B show an instance in which the second interconnect 103e is a lower-layer interconnect and the first interconnect 103c is an upper-layer interconnect, the second interconnect 103c may be a lower-layer interconnect and the first interconnect 103e may be an upper-layer interconnect.

As shown in FIG. 9A, the semiconductor device 100 includes a semiconductor substrate (not shown). The semiconductor device 100 also includes a first etch stop film 302, a first interlayer insulating film 304, a first protecting film 306, a second etch stop film 308, a second interlayer insulating film 310, a third etch stop film 312, a third interlayer insulating film 314, a second protecting film 316, and a fourth etch stop film 318 formed on the semiconductor substrate in this order.

In the state before the cutting processing, the via 103d is electrically connected to the second interconnect 103e and the first interconnect 103c in the first conductor 102 of the electrical fuse 101. The second interconnect 103e is formed in the first etch stop film 302, the first interlayer insulating film 304, and the first protecting film 306. The via 103d is formed in the second etch stop film 308, the second interlayer insulating film 310, and the third etch stop film 312. The first interconnect 103c is formed in the third etch stop film 312, the third interlayer insulating film 314, and the second protecting film 316.

The second interconnect 103e, the via 103d, and the first interconnect 103c may be composed of a composed of a copper-based metal film that contains copper as a major component. The copper-based metal film can contain silver. The copper-based metal film can also contain one or more different elements selected from among Al, Au, Pt, Cr, Mo, W, Mg, Be, Zn, Pd, Cd, Hg, Si, Zr, Ti, and Sn. The copper-based metal film can be formed by, for example, plating. Further, a surface of the copper-based metal film may be provided with, for example, a silicide film formed thereon.

Furthermore, side surfaces and bottoms of each of the first interconnect 103c, the via 103d, and the second interconnect 103e are provided with a barrier metal film 320, wherein the first interconnect 103c, the via 103d, and the second interconnect 103e are covered with and in contact with the barrier metal film 320. The barrier metal film 320 can be composed of a high melting metal. The barrier metal film 320 can be composed of, for example, Ta, TaN, Ti, TiN, W, WN, or the like.

That is, in the state before the cutting processing, the barrier metal film 320 is provided between the second interconnect 103e and the via 103d so as to be in contact therewith. Likewise, the barrier metal film 320 is provided between the via 103d and the first interconnect 103c so as to be in contact therewith.

The first interlayer insulating film 304 and the third interlayer insulating film 314 are composed of a low dielectric film such as SiOC or the like. Examples of a material of the low dielectric film include not only SiOC but also polyhydrogensiloxane such as HSQ (hydrogen silsesquioxane), MSQ (methyl silsesquioxane), and an MHSQ (methyl hydrogen silsesquioxane), aromatic compound-containing organic materials such as polyallyl ether (PAE), divinylsiloxane-bis-benzocyclobutene (BCB), and Silk (registered trademark), SOG, FOX (flowable oxide), CYTOP, BCB (benzocyclobutene), or the like. As the low dielectric film, a porous film of above-described materials may be used. The first interlayer insulating film 304 and the third interlayer insulating film 314 may be composed if either the same material or different materials.

The second interlayer insulating film 310 can be composed of one of the similar materials to those of the first interlayer insulating film 304 and the third interlayer insulating film 314 described above. However, it is preferable that the second interlayer insulating film 310 is composed of a harder material than those of the first interlayer insulating film 304 and the third interlayer insulating film 314 in view of the relation between the first interlayer insulating film 304 and the third interlayer insulating film 314. For example, the second interlayer insulating film 310 can be composed of a material having a higher Young's modulus than those of the first interlayer insulating film 304 and the third interlayer insulating film 314. By so configuring, it is possible to facilitate forming the flowing region 114 in the interconnect portions and forming the cutting portion 112 in the via 103d.

For example, the second interlayer insulating film 310 in which the via 103d is formed is composed of SiOC (Black Diamond) and the third interlayer insulating film 314 in which the first interconnect 103c is formed is composed of SiOC (Aurora). It is noted that Black Diamond and Aurora are SiOC porous films and that Aurora has lower dielectric constant, lower film density, and softer than black diamond.

The second interlayer insulating film 310 is not limited to the above configuration, and materials thereof may be the same as those of the first interlayer insulating film 304 and the third interlayer insulating film 314. In this case, the first interconnect 103c generates self-heating and has a larger expansion amount when a current is applied to the first interconnect 103c whereas the via 103d has a small conductor volume and a small expansion amount by the heat conduction. Due to this, it is possible to selectively form the flowing region 114 in the first interconnect 103c and the cutting portion 112 in the via 103d.

The second etch stop film 308 and the fourth etch stop film 318 function as etch stop films when the via hole and interconnect trench are formed. Besides, the second etch stop film 308 and the fourth etch stop film 318 function to protect diffusion of copper contained in the second interconnect 103e and the first interconnect 103c. The second etch stop film 308 and the fourth etch stop film 318 can be composed of materials harder than those constituting the first interlayer insulating film 304 and the third interlayer insulating film 314. The second etch stop film 308 and the fourth etch stop film 318 can be composed of materials higher in Young's modulus than those of the first interlayer insulating film 304 and the third interlayer insulating film 314. The second etch stop film 308 and the fourth etch stop film 318 can be composed of, for example, SiCN, SiN, SiC, SiOF, SiON, or the like.

The first protecting film 306 and the second protecting film 316 function to protect the first interlayer insulating film 304 and the third interlayer insulating film 314 when the second interconnect 103e and the first interconnect 103c are polished by chemical-mechanical polishing (CMP). The first protecting film 306 and the second protecting film 316 can be composed of, for example, $SiO_2$ films.

The first etch stop film 302 and the third etch stop film 312 can be composed of the same material as that of the second etch stop film 308 and the fourth etch stop film 318. Furthermore, although not shown in FIGS. 9A and 9B, each of the first etch stop film 302 and the third etch stop film 312 can be formed as a multilayer film including a first insulating film composed of the same material as that of the second etch stop film 308 and the fourth etch stop film 318, as well as a second insulating film formed on the first insulating film and composed of the same material as that of the first protecting film 306 and the second protecting film 316.

The second interconnect 103e, the via 103d, the first interconnect 103c, and the like configured as described above can be formed at the same steps as those for an ordinary multilayer interconnect structure. Due to this, the electrical fuse 101 can be formed without having to newly add steps.

Thus, the first interconnect 103c is surrounded by, for example, covering films such as the barrier metal film 320 and the fourth etch stop film 318, and the third interlayer insulating film 314 softer than the covering films is formed around the covering films.

In the first conductor 102 having such configuration, if a predetermined voltage is applied between the first terminal 104 and the second terminal 106 to apply excessive power to the first conductor 102, the constituent material of the first interconnect 103c is expanded in the direction of the third interlayer insulating film 314 that is a soft film. As expansion of the conductor material progresses, cracks are generated in the barrier metal film 320 and the like and the constituent material of the first interconnect 103c flows into the third interlayer insulating film 314 through the cracks. Namely, the constituent material constituting the first interconnect 103c flows outside of the interconnect trench. Such a flowing state occurs in the folded structure 103b of the first interconnect 103c. As a result, as shown in FIG. 8B, the flowing region 114 is formed. At this time, by causing the flowing region 114 to be connected to the second conductor 108, the second terminal 106 is electrically connected to the third terminal 110.

Moreover, because of rapid migration of the conductor material in the direction of the flowing region 114, the conductor material is cut in a portion in which the migration of the conductor material does not follow. In the embodiment, the conductor material is cut in the via 103*d*, and the cutting portion 112 is formed. Such a mechanism enables the flowing region 114 and the cutting portion 112 to be formed to be apart from each other.

In the embodiment, the barrier metal film 320 is formed between the via 103*d* and the second interconnect 103*e*. This can facilitate peeling off the barrier metal film 320 from the second interconnect 103*e*, and forming the flowing region 114 between the barrier metal film 320 and the second interconnect 103*e*.

Moreover, in the state after the cutting processing, the material constituting the via 103*d* moves together with the barrier metal film 320 to form the flowing region 114 between the barrier metal film 320 and the second interconnect 103*e*. Due to this, even if a heat treatment or the like is conducted at a subsequent step, the barrier metal film 320 can prevent the conductive material composed of the copper-based metal film from moving again to reconnect the via 103*d* to the second interconnect 103*e*. It is thereby possible to improve heat resistance of the semiconductor device 100. Because the double barrier metal films 320 are formed between the flowing region 114 and the cutting portion 112, it is possible to further prevent migration of the conductor material.

In the embodiment, the interconnect structure is shown as a single damascene structure. Alternatively, the interconnect structure may be a dual damascene structure.

Furthermore, in the embodiments, the configuration in which the second conductor 108 is provided separately from the cover member 404 has been shown. Alternatively, the cover member 404 can be used as the second conductor 108. In this case, the cover member 404 is arranged at a position in contact with the flowing region 114 when current is applied to the first conductor 102 to form the flowing region 114. Moreover, the cover member 404 can be electrically connected to the third terminal 110.

It is apparent that the present invention is not limited to the above embodiment, that may be modified and changed without departing from the scope and spirit of the invention.

What is claimed is:

1. A semiconductor device, comprising:
   a semiconductor substrate; and
   a plurality of electrical fuses formed on said semiconductor substrate, each electrical fuse including a first terminal, a second terminal, a third terminal, a first conductor and a second conductor,
   wherein the first conductor connects the first terminal to the second terminal, and is electrically separated from the third terminal,
   the first conductor is configured to be split into a first part extending from the first terminal and a second part extending from the second terminal which are electrically separated from each other, and the second conductor extends from the second part and is electrically connected to the third terminal, said second conductor including an interconnect electrically connected to the third terminal and formed on a same layer as the first conductor, and
   a plurality of the first terminals of the electrical fuses are electrically connected to each other.

2. The semiconductor device according to claim 1, further comprising:
   a determination unit configured for applying a predetermined first potential to said second part and detecting a potential of said second part in a state in which said first part of said first conductor is grounded, determining that a cutting process has been performed on the electrical fuse if the potential of said second part is higher than a reference potential, and determining that the cutting process has not been performed on the electrical fuse if the potential of said second part is lower than said reference potential; and
   a potential application unit configured to apply a predetermined second potential to said second conductor.

3. The semiconductor device according to claim 1, further comprising:
   a determination unit configured for applying a predetermined third potential to said second conductor and detecting a potential of said second conductor in a state in which said second part of said first conductor is grounded, determining that a cutting process has been performed on the electrical fuse if the potential of said second conductor is lower than a reference potential, and determining that the cutting process has not been performed on the electrical fuse if the potential of said second conductor is higher than said reference potential.

4. The semiconductor device according to claim 2, further comprising:
   a plurality of said determination units provided to correspond to said plurality of electrical fuses; and
   a first common interconnect connecting said first part of said first conductor of each of said plurality of electrical fuses in common.

5. The semiconductor device according to claim 3, further comprising:
   a plurality of said determination units provided to correspond to said plurality of electrical fuses; and
   a first common interconnect connecting said first part of said first conductor of each of said plurality of electrical fuses in common.

6. The semiconductor device according to claim 1, further comprising:
   a plurality of determination units provided to correspond to said plurality of electrical fuses, each of said plurality of determination units being configured for applying a predetermined first potential to said second part and detecting a potential of said second part in a state in which said first part of said first conductor is grounded, determining that a cutting process has been performed on corresponding one of said plurality of electrical fuses if the potential of said second part is higher than a reference potential, and determining that the cutting process has not been performed on the corresponding one of said plurality of electrical fuses if the potential of said second part is lower than said reference potential; and
   a second common interconnect connecting said second conductor of each of said plurality of electrical fuses in common.

7. The semiconductor device according to claim 1, further comprising:
   an electrical fuse group including the plurality of said electrical fuses;
   a second common interconnect connecting said second conductor of each of said plurality of electrical fuses in common; and
   a determination unit provided in said plurality of electrical fuses, configured for applying a predetermined fourth potential to said second conductor via said second common interconnect and detecting a potential of said second common interconnect in a state in which said second part of said first conductor of each of said plurality of electrical fuses is grounded, determining that a cutting process has been performed on said electrical fuse group if the potential of said second common interconnect is lower than a reference potential, and determining that the cutting process has not been performed on the electrical fuse group if the potential of said second common interconnect is higher than said reference potential.

8. The semiconductor device according to claim 6, further comprising:
a first common interconnect connecting said first part of said first conductor of each of said plurality of electrical fuses in common.

9. The semiconductor device according to claim 7, further comprising:
a first common interconnect connecting said first part of said first conductor of each of said plurality of electrical fuses in common.

10. The semiconductor device according to claim 1, wherein the interconnect is configured to be electrically disconnected from the first conductor in a state before a cutting process, and arranged at a position in contact with the flowing region in a state after the cutting process.

11. The semiconductor device according to claim 1, wherein the first conductor includes a folded structure having a plurality of parallel linear portions.

12. The semiconductor device according to claim 11, wherein during the cutting process, the folded structure forms the flowing region.

13. The semiconductor device according to claim 1, further comprising a cover member formed on the same layer as that on which the first conductor is formed surrounding the electrical fuse.

14. The semiconductor device according to claim 13, wherein the cover member is configured to reflect heat generated in the first conductor by current flowing between the first and second terminals.

15. The semiconductor device according to claim 13, wherein the cover member blocks constituent material of the first conductor from scattering when the first conductor is cut during a cutting process.

16. The semiconductor device according to claim 1, wherein a cutting portion between the first and the second parts is disposed at a position closer to the first terminal than the second terminal.

17. The semiconductor device according to claim 1, wherein a cutting portion is positioned so that a length of a current path through the second part becomes longer than a current path through the first part when flowing a predetermined current through the first conductor.

18. The semiconductor device according to claim 1, wherein the first conductor includes a bent structure having a plurality of parallel linear portions.

19. The semiconductor device according to claim 18, wherein during a cutting process, the bent structure is configured to form a flowing region.

20. The semiconductor device according to claim 1, wherein at least part of the second part configures a structure in which the first conductor is bent.

21. The semiconductor device according to claim 1, wherein the second part is configured to include a flowing region from which a material constituting the first conductor flows outward, and the second part and the second conductor are electrically connected via the flowing region.

22. The semiconductor device according to claim 1, wherein the first part is narrower than the second part.

23. A semiconductor device, comprising:
a semiconductor substrate; and
a plurality of electrical fuses formed on said semiconductor substrate, each electrical fuse including a first terminal, a second terminal, a third terminal, a first conductor and a second conductor,
wherein the first conductor connects the first terminal to the second terminal, and is electrically separated from the third terminal,
the first conductor is configured to be split into a first part extending from the first terminal and a second part extending from the second terminal which are electrically separated from each other, and the second conductor extends from the second part and is electrically connected to the third terminal, and
a plurality of the first terminals of the electrical fuses are electrically connected to each other,
wherein the first and second terminals are formed on different layers, and the first conductor includes a first interconnect formed on the same layer as the second terminal, a second interconnect formed on the same layer as that upon which the first terminal is formed, and a via electrically interconnecting the first and second interconnects.

24. A semiconductor device, comprising:
a plurality of electrical fuses formed on a semiconductor substrate;
wherein the electrical fuses includes at least an electrical fuse which is configured to be cut, and at least a dummy electrical fuse which is not configured to be cut, and
the dummy electrical fuse which is not separable includes a first terminal, a second terminal, a third terminal, a first conductor connecting the first terminal and the second terminal, and a second conductor extending from the third terminal and electrically separated from the first terminal and the second terminal, and
the electrical fuse which is separable includes a fourth terminal, a fifth terminal, a sixth terminal, a first part of a third conductor extending from the fourth terminal, a second part of the third conductor extending from the fifth terminal and configured to be separated from the first part of the third conductor by cutting the electrical fuse, and a fourth conductor extending from the sixth terminal and electrically connected to the second part of the third conductor and electrically separated from the first part of the third conductor,
wherein a plurality of the first terminal and a plulrality of the fourth terminals of the electrical fuses are electrically connected to each other.

25. A semiconductor device, comprising:
a semiconductor substrate; and
an electrical fuse formed on said semiconductor substrate, and including a first terminal, a second terminal, a third terminal, a first conductor connecting said first terminal to said second terminal, and a second conductor extending from said third terminal;
wherein said second conductor is not connected to both said first terminal and said second terminal,
said first conductor includes a first part extending from said first terminal and a second part extending from said second terminal,
said first part is connected to said second part,
said second part includes a bent structure having a plurality of parallel linear portions, and
said second part is located closer to said second conductor than said first part.

26. The semiconductor device according to claim 25, where said first part is narrower than said second part.

\* \* \* \* \*